US011355585B2

(12) United States Patent
Coyne et al.

(10) Patent No.: US 11,355,585 B2
(45) Date of Patent: Jun. 7, 2022

(54) BIPOLAR JUNCTION TRANSISTOR, AND A METHOD OF FORMING A CHARGE CONTROL STRUCTURE FOR A BIPOLAR JUNCTION TRANSISTOR

(71) Applicant: Analog Devices International Unlimited Company, Limerick (IE)

(72) Inventors: Edward John Coyne, Athenry (IE); Alan Brannick, Raheen (IE); Shane Tooher, Kilmallock (IE); Breandán Pol Og Ó hAnnaidh, Raheen (IE); Catriona Marie O'Sullivan, Kilcornan (IE); Shane Patrick Geary, Sixmilebridge (IE)

(73) Assignee: Analog Devices International Unlimited Company, Limerick (IE)

( * ) Notice: Subject to any disclaimer, the term of this patent is extended or adjusted under 35 U.S.C. 154(b) by 280 days.

(21) Appl. No.: 16/590,142

(22) Filed: Oct. 1, 2019

(65) Prior Publication Data
US 2021/0098575 A1 Apr. 1, 2021

(51) Int. Cl.
*H01L 29/08* (2006.01)
*H01L 21/8228* (2006.01)
(Continued)

(52) U.S. Cl.
CPC .... *H01L 29/0804* (2013.01); *H01L 21/82285* (2013.01); *H01L 27/0826* (2013.01);
(Continued)

(58) Field of Classification Search
CPC .................................................. H01L 29/0804
See application file for complete search history.

(56) References Cited

U.S. PATENT DOCUMENTS

| 3,702,428 A | 11/1972 | Schmitz et al. |
| 4,431,460 A | 2/1984 | Barson et al. |
| (Continued) | | |

FOREIGN PATENT DOCUMENTS

| CN | 102403345 A | 4/2012 |
| CN | 102522425 A | 6/2012 |
| (Continued) | | |

OTHER PUBLICATIONS

Extended European Search Report dated Jun. 21, 2021 in Application No. 20197996.0.
(Continued)

*Primary Examiner* — Douglas M Menz
(74) *Attorney, Agent, or Firm* — Knobbe, Martens, Olson & Bear, LLP

(57) ABSTRACT

A charge control structure is provided for a bipolar junction transistor to control the charge distribution in the depletion region extending into the bulk collector region when the collector-base junction is reverse-biased. The charge control structure comprises a lateral field plate above the upper surface of the collector and dielectrically isolated from the upper surface of the collector and a vertical field plate which is at a side of the collector and is dielectrically isolated from the side of the collector. The charge in the depletion region extending into the collector is coupled to the base as well as the field-plates in the charge-control structure, instead of only being coupled to the base of the bipolar junction transistor. In this way, a bipolar junction transistor is provided where the dependence of collector current on the collector-base voltage, also known as Early effect, can be reduced.

20 Claims, 25 Drawing Sheets

(51) Int. Cl.
*H01L 27/082* (2006.01)
*H01L 29/40* (2006.01)
*H01L 29/66* (2006.01)
*H01L 29/732* (2006.01)

(52) U.S. Cl.
CPC ........ *H01L 29/0821* (2013.01); *H01L 29/404* (2013.01); *H01L 29/407* (2013.01); *H01L 29/66272* (2013.01); *H01L 29/732* (2013.01)

(56) References Cited

U.S. PATENT DOCUMENTS

| | | |
|---|---|---|
| 4,531,282 A | 7/1985 | Sakai et al. |
| 4,571,817 A | 2/1986 | Birritella et al. |
| 5,171,697 A | 12/1992 | Liu et al. |
| 5,341,022 A | 8/1994 | Kuroi et al. |
| 5,502,330 A | 3/1996 | Johnson et al. |
| 5,572,049 A | 11/1996 | Wen et al. |
| 5,592,017 A | 1/1997 | Johnson |
| 5,716,859 A | 2/1998 | Tajadod et al. |
| 5,899,714 A | 5/1999 | Farrenkopf et al. |
| 6,004,865 A | 12/1999 | Horiuchi et al. |
| 6,051,474 A | 4/2000 | Beasom |
| 6,130,136 A | 10/2000 | Johnson et al. |
| 6,265,275 B1 | 7/2001 | Marty et al. |
| 6,436,781 B2 | 8/2002 | Sato |
| 6,445,058 B1* | 9/2002 | Thiel .............. H01L 29/0804 257/565 |
| 6,531,721 B1 | 3/2003 | Burton et al. |
| 6,673,687 B1 | 1/2004 | Burton et al. |
| 6,750,528 B2 | 6/2004 | Chyan |
| 6,759,730 B2 | 7/2004 | Chaudhry et al. |
| 7,132,344 B1 | 11/2006 | Knorr |
| 7,345,342 B2 | 3/2008 | Challa et al. |
| 7,713,811 B2 | 5/2010 | Kerr et al. |
| 7,728,357 B2 | 6/2010 | Murayama et al. |
| 8,222,114 B2 | 7/2012 | Chiu et al. |
| 8,415,764 B2 | 4/2013 | Chung et al. |
| 8,420,475 B2 | 4/2013 | Chiu et al. |
| 8,916,951 B2 | 12/2014 | Mallikarjunaswamy et al. |
| 9,214,534 B2 | 12/2015 | Mallikarjunaswamy et al. |
| 9,324,846 B1 | 4/2016 | Camillo-Castillo et al. |
| 2002/0041008 A1 | 4/2002 | Howard et al. |
| 2004/0188712 A1 | 9/2004 | Lee et al. |
| 2005/0035431 A1 | 2/2005 | Masuda |
| 2005/0054170 A1 | 3/2005 | Steinmann et al. |
| 2007/0145378 A1 | 6/2007 | Agarwal et al. |
| 2008/0227262 A1 | 9/2008 | El-Kareh et al. |
| 2008/0265282 A1 | 10/2008 | Gluschenkov et al. |
| 2010/0155773 A1* | 6/2010 | Parthasarathy ....... H01L 29/407 257/E29.201 |
| 2013/0099351 A1 | 4/2013 | Chen et al. |
| 2014/0327110 A1 | 11/2014 | Gridelet et al. |
| 2015/0014791 A1 | 1/2015 | Coyne et al. |
| 2015/0340440 A1 | 11/2015 | Coyne et al. |
| 2015/0349100 A1 | 12/2015 | Umemoto et al. |
| 2016/0133732 A1 | 5/2016 | Umemoto et al. |
| 2016/0141375 A1* | 5/2016 | Alexander ............ H01L 29/732 257/488 |
| 2017/0243962 A1* | 8/2017 | Lu .......................... H01L 29/417 |
| 2018/0301584 A1 | 10/2018 | Augusto |
| 2018/0308961 A1 | 10/2018 | Tilke et al. |

FOREIGN PATENT DOCUMENTS

| | | |
|---|---|---|
| EP | 0 938 140 A2 | 8/1999 |
| JP | H05218319 A | 8/1993 |
| JP | H07288284 A | 10/1995 |
| JP | 2000068281 A | 3/2000 |

OTHER PUBLICATIONS

Extended European Search Report dated Mar. 3, 2021 in European Application No. 20198008.3.
Bashir et al., "A Complementary Bipolar Technology Family With a Vertically Integrated PNP for High-Frequency Analog Applications", IEEE Transactions on Electron Devices, vol. 48, No. 11, Nov. 2001, pp. 2525-2534.
Coyne et al., "The 36 V Bipolar: β x Va x fT x BV x JfT x Linearity Tradeoff", IEEE Transactions on Electron Devices, vol. 64, No. 1, Jan. 2017, pp. 8-14.
Harrington et al., "A High Performance 36V Complementary Bipolar Technology on Low Thermal Resistance Compound Buried Layer SOI Substrates", IEEE, 2017 pp. 37-40.
Óhannaidh et al., "A Tunable Bipolar: Investigation of effects and a MEXTRAM based VerilogA model adaptation of Field Effect Electrode influenced High Voltage SiGe HBTs", IEEE, 2017 in 4 pages.
Rücker et al., "SiGe HBT Technology", Silicon-Germanium Heterojunction Bipolar Transistors for mm-Wave Systems: Technology, Modeling and Circuit Applications, NiccolóRinaldi, Michael Schröter eds., , pp. 11-54, River Publishers, Mar. 15, 2018.
Schaffer et al., "A 36 V Programmable Instrumentation Amplifier With Sub-20 μV Offset and a CMRR in Excess of 120 dB at All Gain Settings", IEEE Journal of Solid-State Circuits, vol. 44, No. 7, Jul. 2009, pp. 2036-2046.
Sharma et al., "Study the Development and Operation of Discrete Vertical Drain Lateral-Diffused MOS (VDMOS) Power Transistors", International Journal of Innovative Research in Computer and Communication Engineering, vol. 4, Issue 4, Apr. 2016 in 7 pages.
Würfl et al., "Device breakdown and dynamic effects in GaN power switching devices: Dependencies on material properties and device design", The Electrochemical Society, 2012 in 1 page.
Zareiee, "A New Structure for Lateral Double Diffused MOSFET to Control the Breakdown Voltage and the On-Resistance", Springer Nature B.V., Feb. 4, 2019 in 9 pages.
Partial European Search Report dated Mar. 19, 2021 in Application No. 20197996.0.
Extended European Search Report dated Feb. 25, 2021 in European Application No. 20198015.8.
Hueting et al., "A New Trench Bipolar Transistor for RF Applications", IEEE Transactions on Electron Devices, vol. 51, No. 7, Jul. 2004.

* cited by examiner

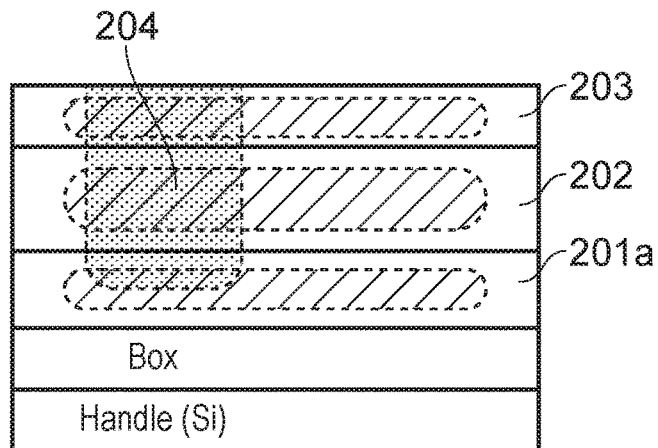
FIG. 2G
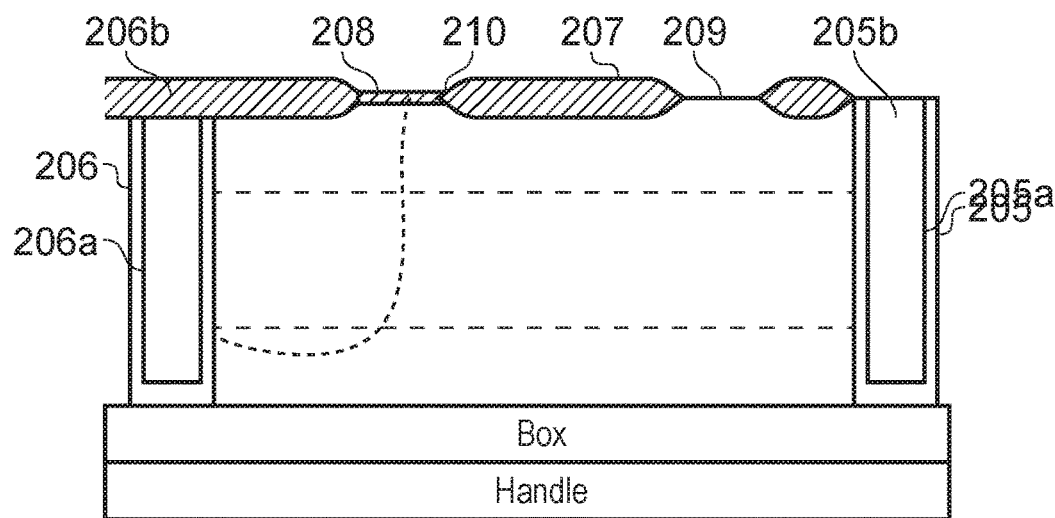
FIG. 2H(i)
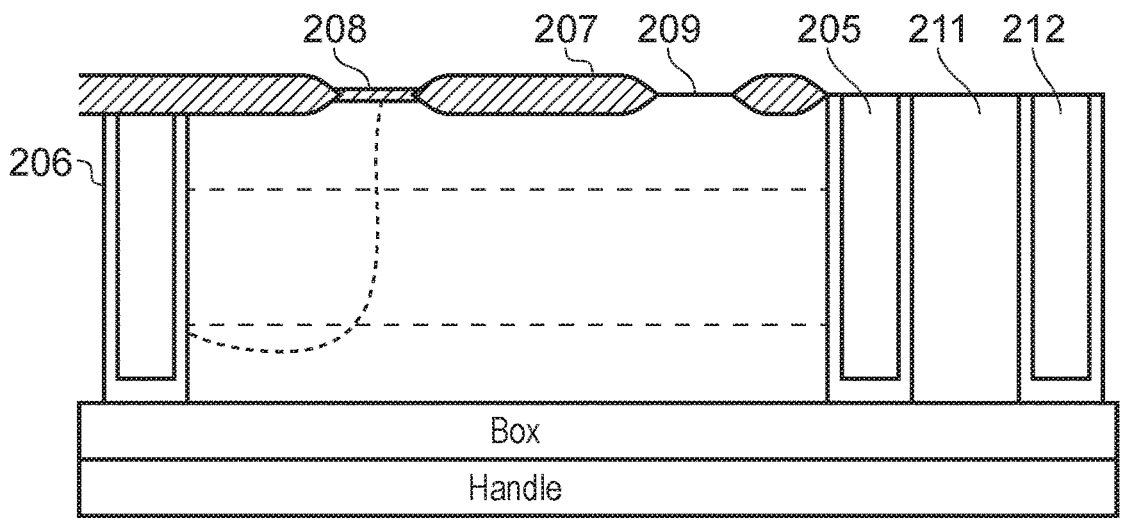
FIG. 2H(ii)

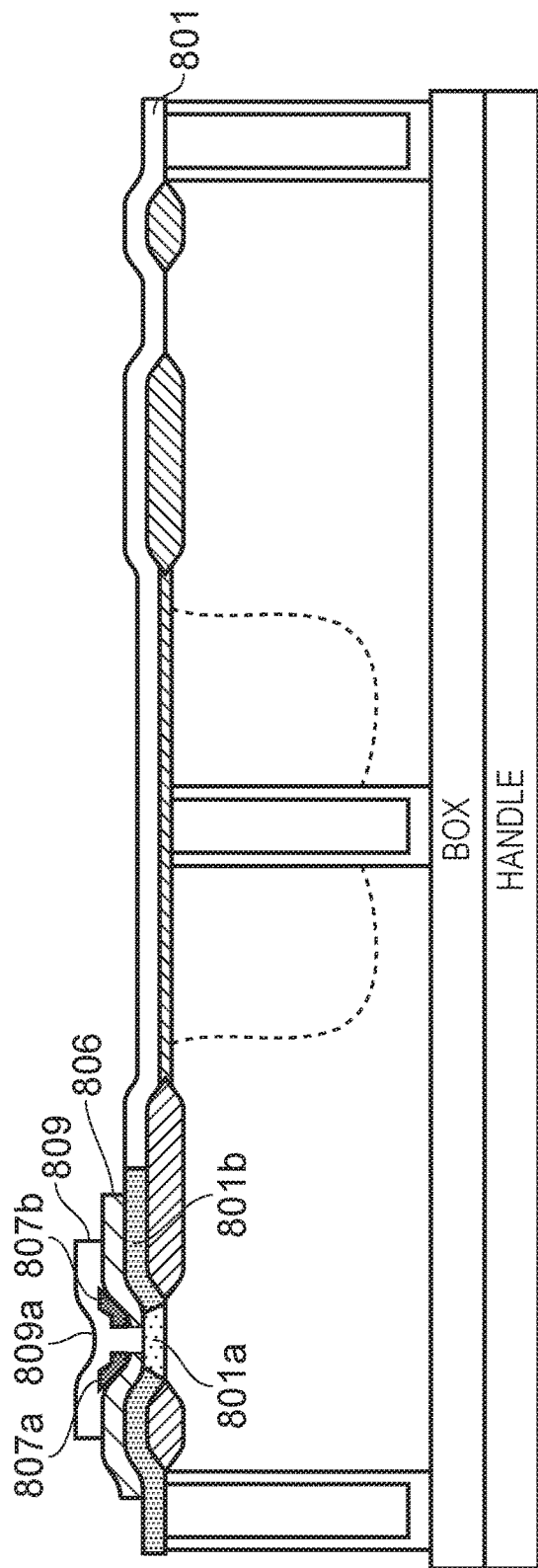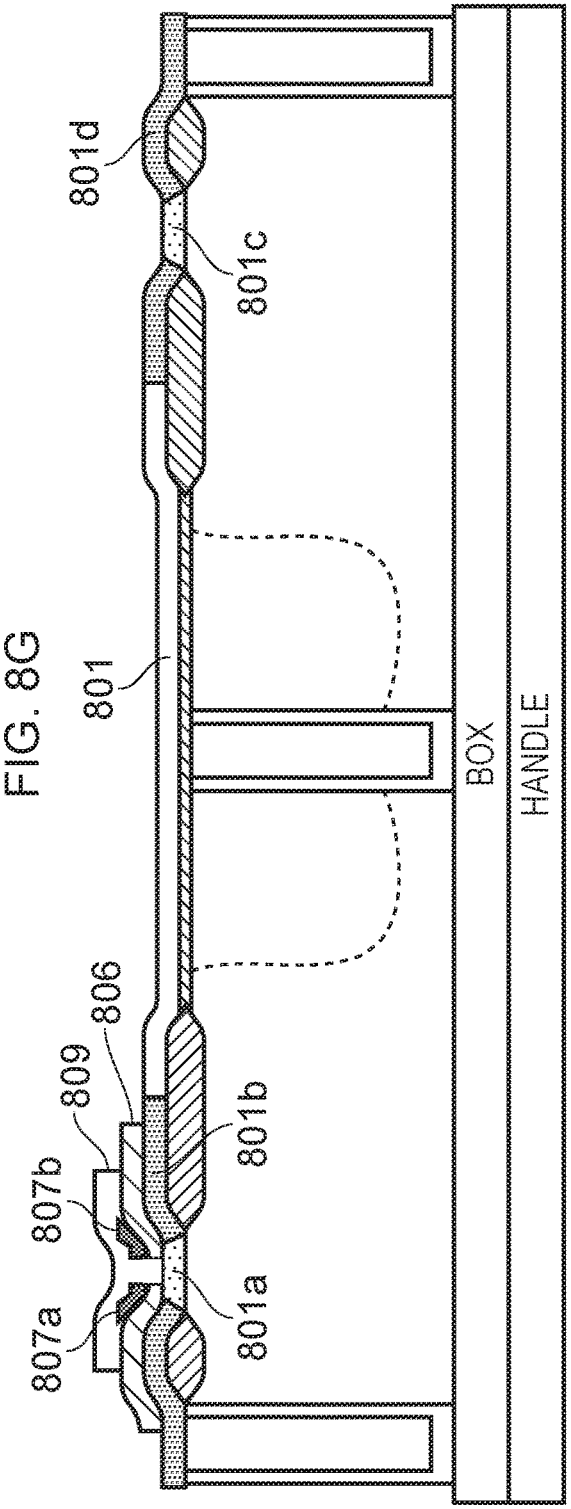

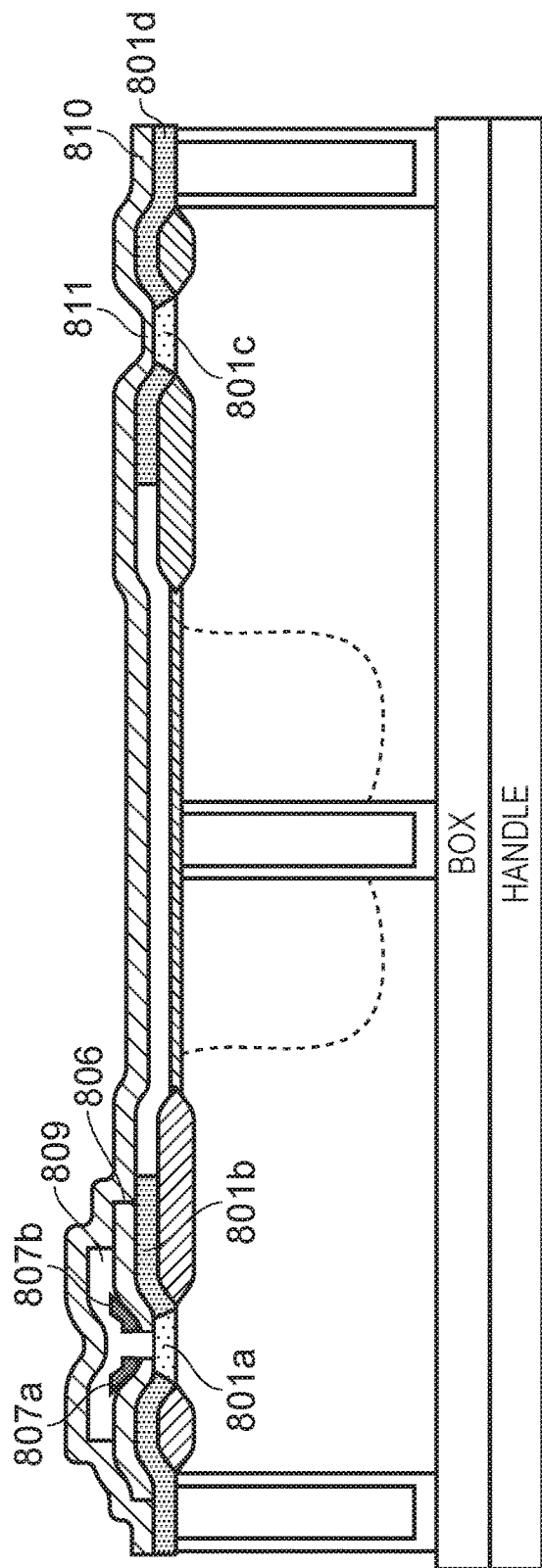
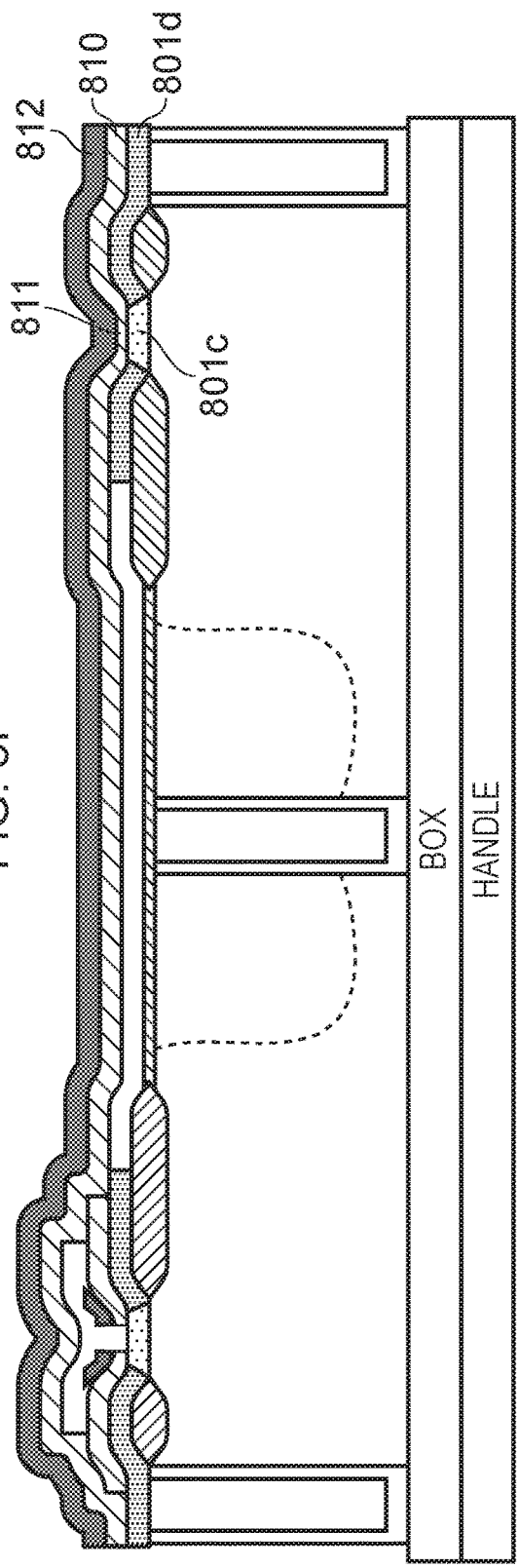

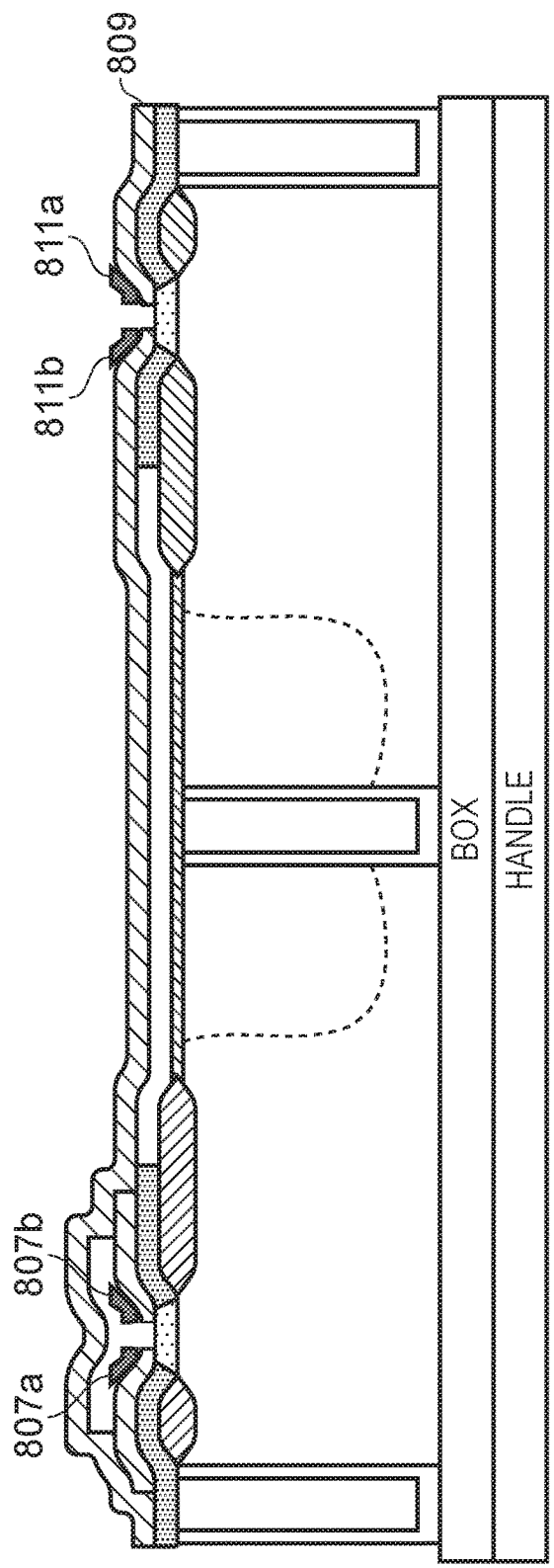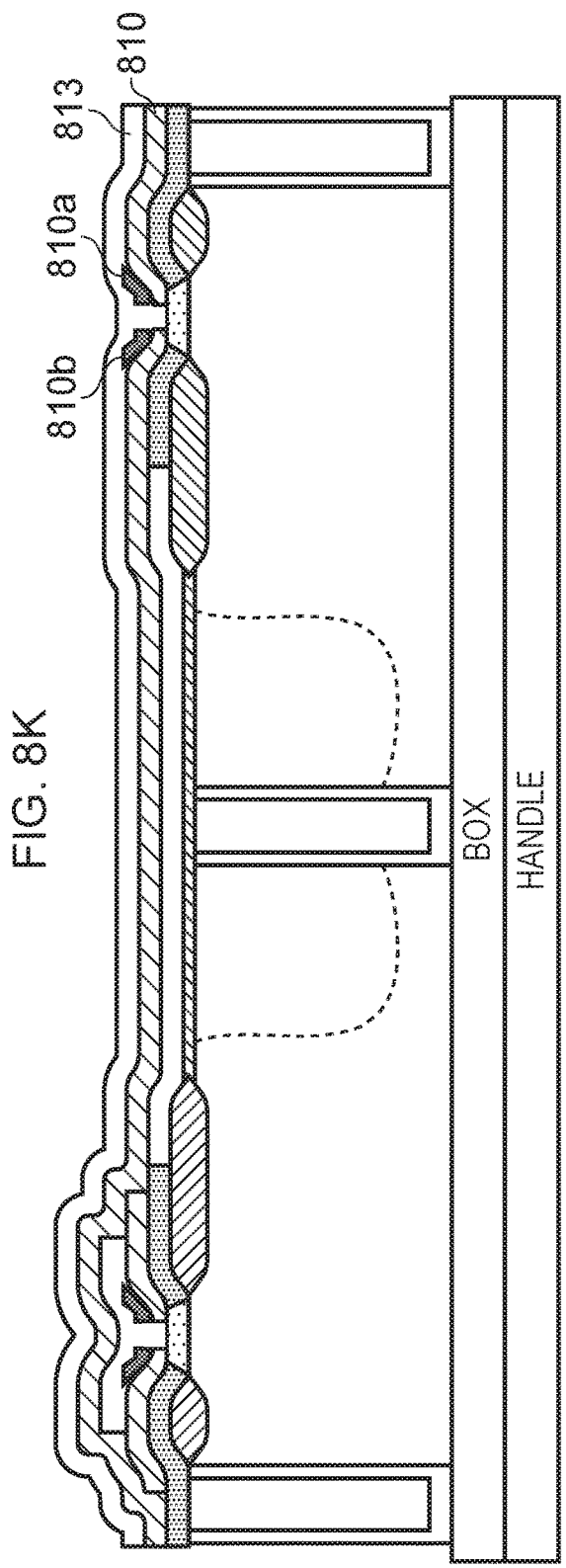

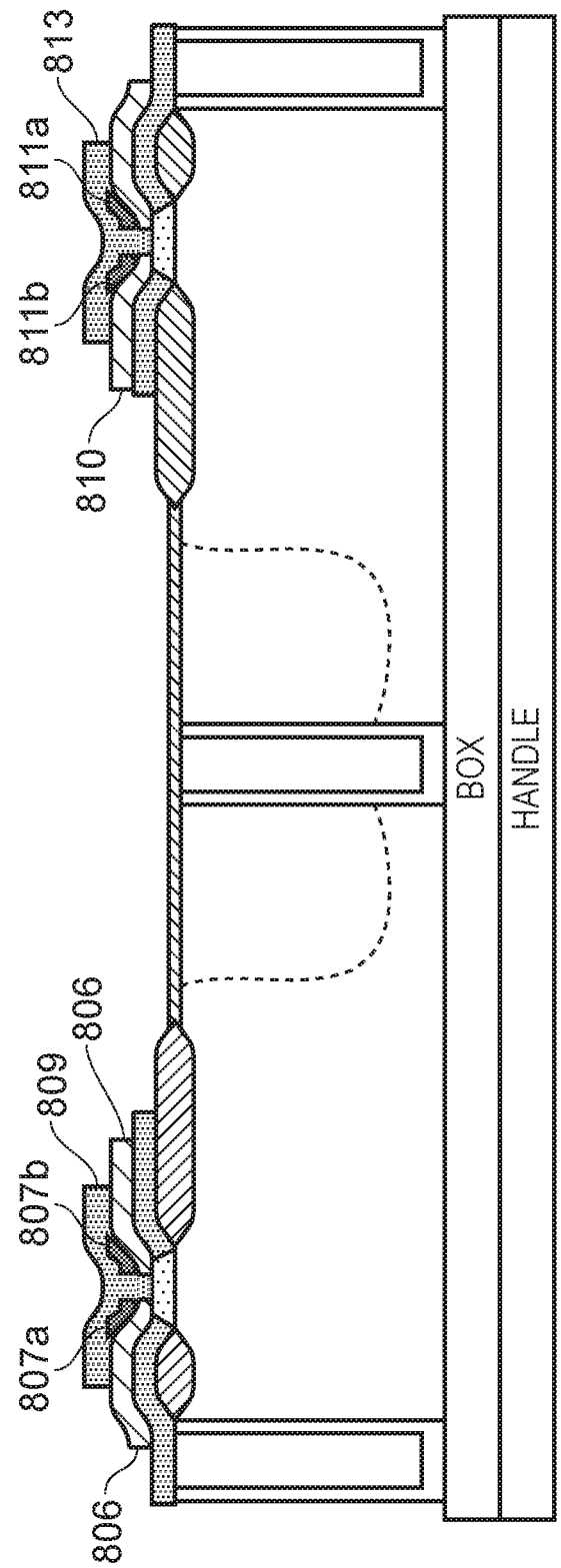

BIPOLAR JUNCTION TRANSISTOR, AND A METHOD OF FORMING A CHARGE CONTROL STRUCTURE FOR A BIPOLAR JUNCTION TRANSISTOR

BACKGROUND

Field

The present disclosure relates to a bipolar junction transistor with a modified structure for improved speed and breakdown voltage characteristics. In particular, it relates to a bipolar junction transistor with modified emitter and collector architectures and a charge control structure.

Description of the Related Art

Bipolar junction transistors are used in different types of analog circuits. In particular, they are commonly used in analog amplifier circuits. The design and implementation of the analog circuit defines the required targets for the performance parameters, such as gain, speed and breakdown voltage (which defines the maximum useful operating voltage) of the bipolar junction transistor. Conventionally, optimizing the performance of the bipolar junction transistor is complex and is limited due to known trade-offs such as the trade-off between gain and Early voltage and the trade-off between speed and breakdown voltage as defined by the Johnson limit. Therefore, there is a need to modify the architecture of the transistor to at least expand the boundary imposed by these trade-offs on the performance of the transistor.

SUMMARY

A charge control structure is provided for a bipolar junction transistor to control the charge distribution in the depletion region extending into the bulk collector region when the collector-base junction is reverse-biased. The charge control structure comprises a lateral field plate above the upper surface of the collector and dielectrically isolated from the upper surface of the collector and a vertical field plate which is at a side of the collector and is dielectrically isolated from the side of the collector. The charge in the depletion region extending into the collector is coupled to the base as well as the field-plates in the charge-control structure, instead of only being coupled to the base of the bipolar junction transistor. In this way, a bipolar junction transistor is provided where the dependence of collector current on the collector-base voltage, also known as Early effect, can be reduced.

According to a first aspect of this disclosure, there is provided a bipolar junction transistor, comprising: a collector; a base; an emitter; and a charge control structure configured to control, in use, a charge distribution in the collector to control the breakdown voltage of the transistor, wherein the charge control structure comprises: a first field plate, extending laterally over, and insulated from, an upper surface of the collector; and a second field plate, extending vertically adjacent, and insulated from, a side of the collector.

According to a second aspect of this disclosure, there is provided a method of manufacturing a bipolar junction transistor, comprising: providing a wafer; forming a collector region; forming a vertical field plate, extending vertically adjacent, and insulated from, a side of the collector region; forming a base region; forming a horizontal field plate extending laterally over, and insulated from, an upper surface of the collector region; forming an emitter region; and forming contacts for each of the collector, base and emitter regions, wherein the vertical and horizontal field plates form a charge control structure configured to control, in use, a charge distribution in the collector to control the breakdown voltage of the transistor.

According to a third aspect of this disclosure, there is provided a bipolar junction transistor, comprising: a collector on a buried oxide layer of a silicon-on-oxide substrate, wherein the collector comprises a collector sink close to a first dielectrically isolated trench on a first side of the transistor; a dielectric layer recessed into the upper surface of the collector, wherein the dielectric layer comprises a plurality of openings; an emitter and a base proximal to a second dielectrically isolated trench on a second side of the transistor opposite to the first side, wherein the emitter is positioned over a crystalline intrinsic region of the base; a first field plate structure extending laterally over the dielectric layer towards the collector sink; an emitter, a base and a collector contact, wherein the base contact connects to an extrinsic polycrystalline portion of the base, such that the base contact is aligned with and positioned over the second dielectrically isolated trench.

Further features of the disclosure are defined in the appended claims.

BRIEF DESCRIPTION OF THE DRAWINGS

The teachings of this disclosure will be discussed, by way of non-limiting examples, with reference to the accompanying drawings, in which:

FIG. 2G shows the complete structure of the multilayer collector after the individual growth and implantation stages;

FIG. 2H(i) shows a cross-section of the trench structure comprising dielectrically isolated trenches.

FIG. 2H(ii) shows another embodiment of the trench structure.

FIG. 8G shows the polysilicon layer etched to form the emitter structure for the NPN bipolar junction transistor;

FIG. 8H shows the formation of the intrinsic and extrinsic base regions for the PNP bipolar junction transistor;

FIG. 8I shows the formation of an oxide layer over the SiGe layer;

FIG. 8J shows the formation of a nitride layer over the oxide layer;

FIG. 8K shows the nitride layer etched to form spacer regions over the intrinsic base for the PNP bipolar junction transistor;

FIG. 8L shows the formation of an epitaxially deposited polysilicon layer over the oxide layer and the spacer regions;

FIG. 8M shows the epitaxially grown polysilicon layer etched and doped to form the emitter structure for the PNP bipolar junction transistor and the doped emitter structure of the NPN transistor;

DETAILED DESCRIPTION

The present disclosure provides a bipolar junction transistor with a modified structure for improved speed and breakdown voltage characteristics. In particular, it relates to a bipolar junction transistor with modified collector and emitter architectures and a charge control structure. In order to allow for better control of the dopant concentration profile in the collector region, the collector is grown as a multilayer collector with layers which are individually grown in separate epitaxial growth stages. For a PNP transistor, each layer, after it is grown, is doped in a dedicated implant stage. In this way, the thickness of each layer and the concentration of dopant in each layer can be better controlled to optimise the speed and breakdown voltage parameters for the bipolar junction transistor.

The disclosure also addresses the problem of the dependence of collector current on the collector-base voltage, also known as the Early effect. In use, the collector-base junction is reverse-biased resulting in a depletion or space-charge region that spreads across the base-collector interface into the bulk collector region below the base. The inventors have realised that the dependence of collector current on the collector-base voltage can be reduced by reducing the coupling of the charge from the space-charge region to the base and instead, coupling this charge to a charge control structure adjacent the space-charge region.

The emitter architecture can also be optimised to improve the performance of the bipolar junction transistor. In particular, the disclosure provides a single complementary fabrication process for PNP and NPN transistors, while providing separate emitter architectures to optimise the performance for a given type of transistor. The disclosure provides a process for optimising the thickness of the emitter and the thickness of the interfacial oxide between the emitter and the intrinsic base region for a given type of transistor to optimise the performance of the transistor. The fabrication process advantageously allows for flexibility in the design of the emitter architecture for a given type of transistor while still benefiting from the common processing advantages of a complementary bipolar fabrication process.

As used herein, the terms "above", "below", "at a side of" and so on refer to components or regions as set out in the accompanying figures and are not intended to be limiting of real world devices.

Figure 1:
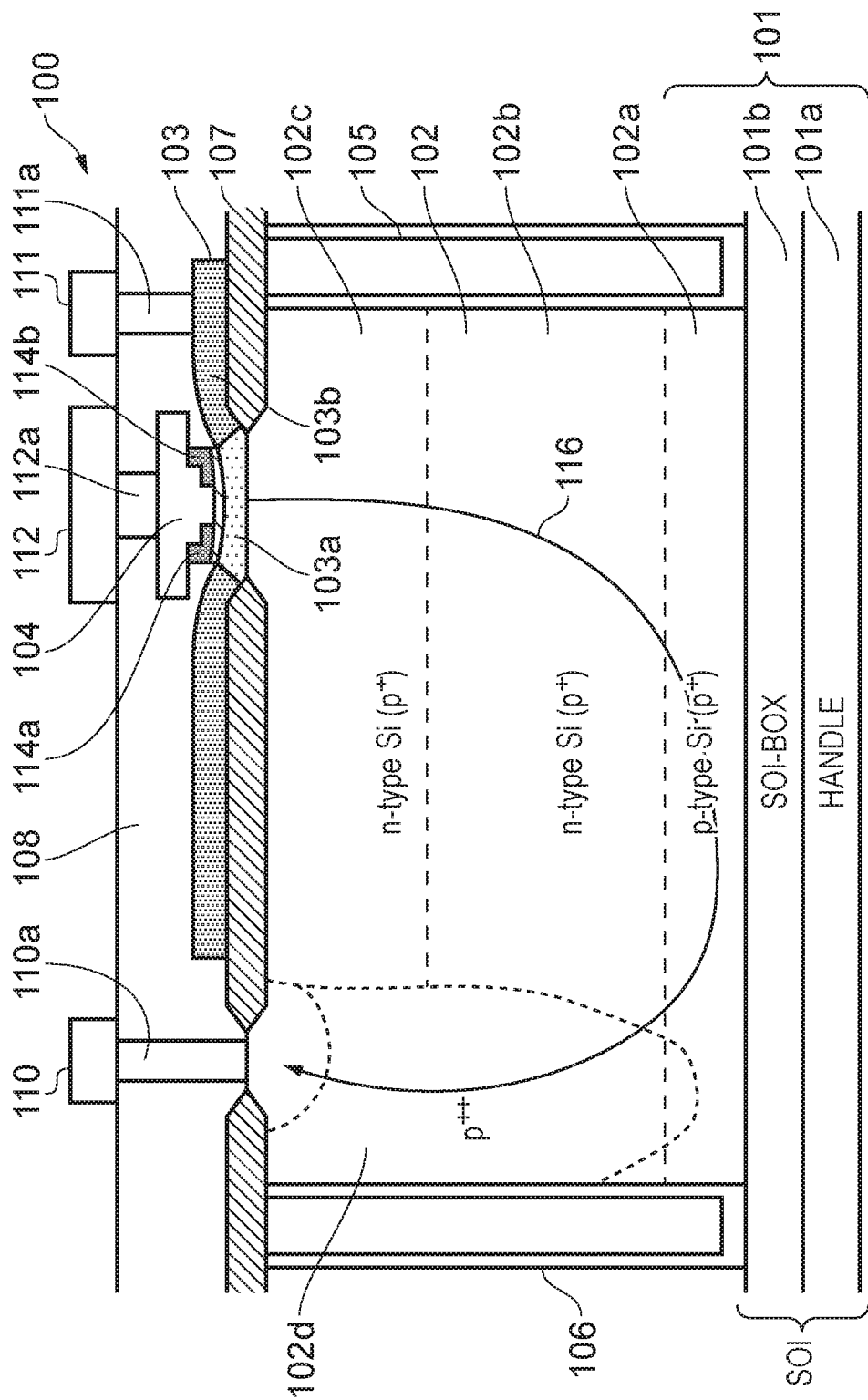
FIG. 1 is a cross-section through a bipolar junction transistor according to a first embodiment of this disclosure.

FIG. 1 is a schematic cross-section of a PNP bipolar junction transistor 100 according to an embodiment of this disclosure. The transistor is not drawn to scale and the features around the base and emitter regions have been drawn disproportionately large to show their structure.

FIG. 1 shows a cross-section through a PNP bipolar junction transistor 100 formed
on a silicon-on-oxide substrate 101. The silicon-on-oxide substrate comprises a three layer material stack. The bottom-most layer of this stack is a bulk silicon support wafer (handle) 101a. A dielectric layer of silicon dioxide 101b (buried oxide or box layer) overlies the bulk silicon support wafer. A layer of doped silicon 102a which, in FIG. 1, is a p-type silicon layer, overlies the buried oxide layer 101b.

Layer 102a also forms part of the collector 102 of the transistor as will be explained in detail below. The transistor comprises a collector 102, a base 103 and an emitter 104. Trenches 105, 106, which are positioned at opposite sides of the collector, are dielectrically isolated from the sides of the collector. Portions of the upper surface of the collector 102 comprise insulating regions 107 which are recessed into the surface of the collector. Further insulating layers may be deposited to form the structure 108 as shown in FIG. 1. An oxide layer such as silicon dioxide may be used to form the insulating region 107 and the additional insulating layers 108. Collector contact 110, base contact 111 and emitter contact 112 are then formed by way of conductive vias 110a, 111a and 112a, extending through the apertures in these insulating layers to the surface of the collector, base and emitter regions, respectively. In the transistor 100 of FIG. 1, the emitter contact 112 is laterally arranged to be positioned between the collector contact 110 and the base contact 111.

The p-type collector 102 in FIG. 1 comprises three doped silicon layers 102a, 102b and 102c of differing thicknesses to each other. The collector 102 further comprises a highly doped p-type sinker region 102d proximal to one side of the collector and aligned below the collector contact 110. The sinker region 102d is used to make a low resistive path to the buried layer 102a of the collector. The sinker region has a higher dopant concentration than the intermediate layer 102b or top layer 102c.

The intermediate layer 102b and the top layer 102c are individually grown in separate epitaxial growth stages as n-type epitaxial layers. Each of the buried, intermediate and top layer has a dedicated implant stage where it is implanted with a p-type dopant and has a corresponding dopant concentration profile which is partly determined by the thickness of the layer. The collector contact 110 is formed by extending a metal via 110a through an aperture in the insulating layers 108 to the upper surface of the collector, as shown in FIG. 1.

In the embodiment of FIG. 1, the intermediate layer 102b is thicker than the top layer 102c and the ratio of the thickness of the intermediate layer to the top layer can be configured to optimise dopant diffusivity rates to create a desired dopant concentration profile across the epitaxial layers for a specified thermal budget. In particular, the thickness of the collector layers and their corresponding dopant concentration profiles are determined by the desired breakdown voltage of the bipolar transistor.

As n-type epitaxial layers are used to form the intermediate and top layers of the collector, the multilayer collector stack can be used, without any ion implantations stages, for the formation of an n-type collector for a NPN transistor. That is, the n-type dopant concentration during the epitaxial growth of the n-type silicon layers for the multilayer collector can be optimised for a desired breakdown voltage of a NPN bipolar junction transistor. Therefore, the collectors for NPN and PNP bipolar junction transistors can be formed on a common silicon-on-oxide substrate, in a complementary fabrication process.

The base 103 of the PNP transistor 100 in FIG. 1 is formed by a layer of n-type semiconductor such as an n-type SiGe layer. The base 103 comprises an intrinsic base region 103a and an extrinsic base region 103b on either side of the intrinsic base region and contiguous with the intrinsic base region. The base contact 111 in FIG. 1 is formed by extending a metal or doped semiconductor via 111a through an aperture in the insulating layers 108 to the upper surface of the extrinsic base region proximal to the trench 105.

The emitter 104 of the PNP transistor in FIG. 1 is a p-type polysilicon emitter which is positioned above the intrinsic base 103a and is physically separated from the intrinsic base using an interfacial oxide layer (IFO) 115. The emitter 104 in FIG. 1 is embedded in the insulating structure 108. L-shaped spacer regions 114a, 114b typically formed using an oxide or a nitride layer are positioned between an edge of the emitter and the base to define a width of a region of the emitter adjacent the intrinsic base. The emitter contact 112 in FIG. 1 is formed by extending a metal via 112a through an aperture in the insulating layers 108 to the upper surface of the polysilicon emitter structure.

The transistor 100 in FIG. 1 is a vertical transistor. This is indicated by the current conduction path 116 where the carrier flow is vertical in the emitter-base region and continues vertically into the active collector region of the transistor beneath the intrinsic base 103a region extending into the buried layer 102a. In the buried layer 102a, the current flows laterally towards the sinker region 102d in contact with the buried layer 102a. The current is then conducted vertically through the sinker region 102d to the collector contact 110.

A method of fabricating a multilayer collector 102 will now be described with reference to FIGS. 2A to 2G and the process flow chart in FIG. 3.

Figure 2A:
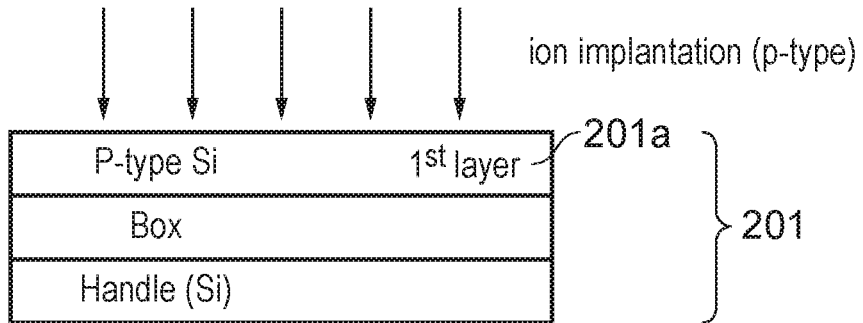
FIG. 2A schematically illustrates a silicon-on-oxide wafer at an initial phase of a fabrication process for the collector of the transistor shown in FIG. 1.
Figure 2B:
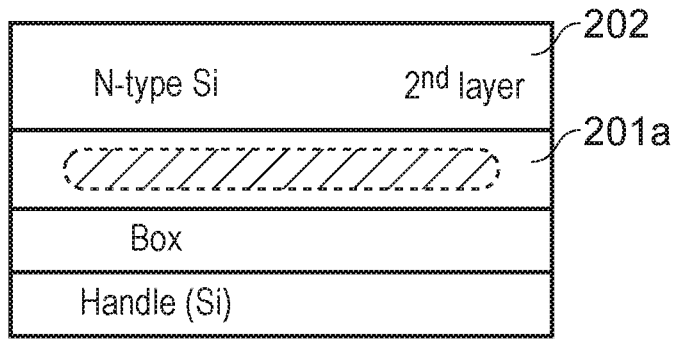
FIG. 2B shows the collector with a first doped silicon layer and an n-type epitaxial layer over the first doped silicon layer.
Figure 2C:
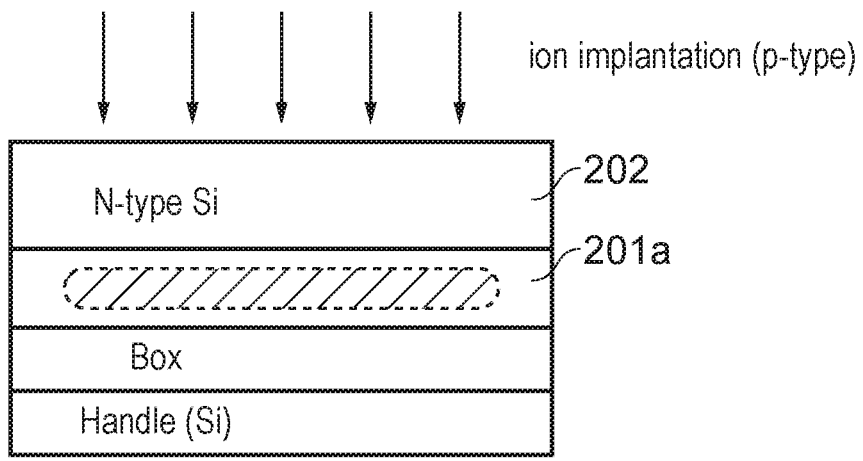
FIG. 2C shows the collector with the n-type epitaxial layer being subject to ion implantation.
Figure 2D:
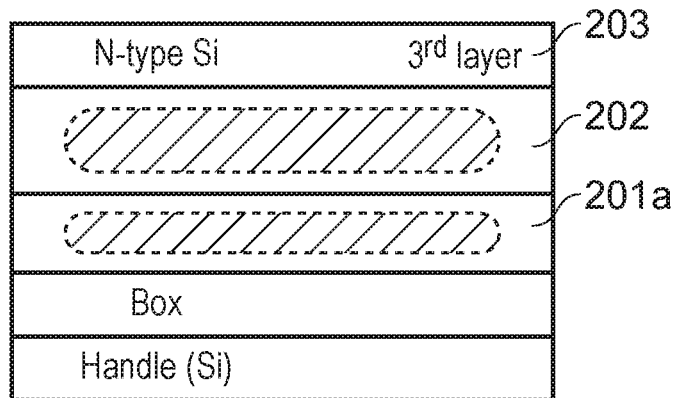
FIG. 2D shows the collector after the deposition of a top n-type epitaxial layer over the doped intermediate n-type epitaxial layer.
Figure 2E:
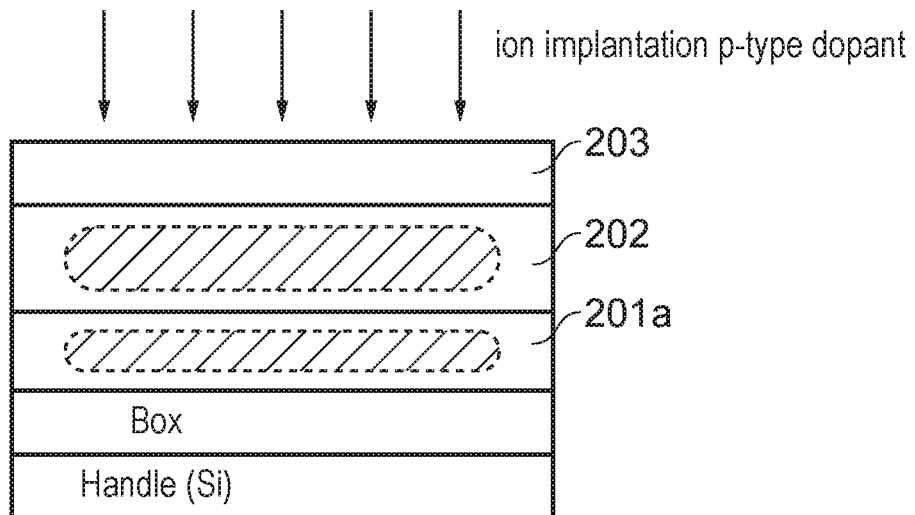
FIG. 2E shows the collector with the top n-type epitaxial layer being subject to ion implantation.
Figure 2F:
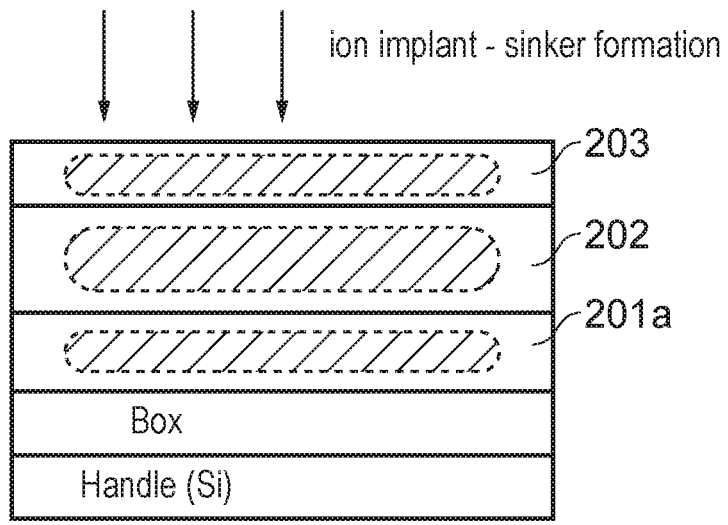
FIG. 2F shows a portion of the multilayer collector being subject to ion implantation to form the sinker region of the collector.
Figure 3:
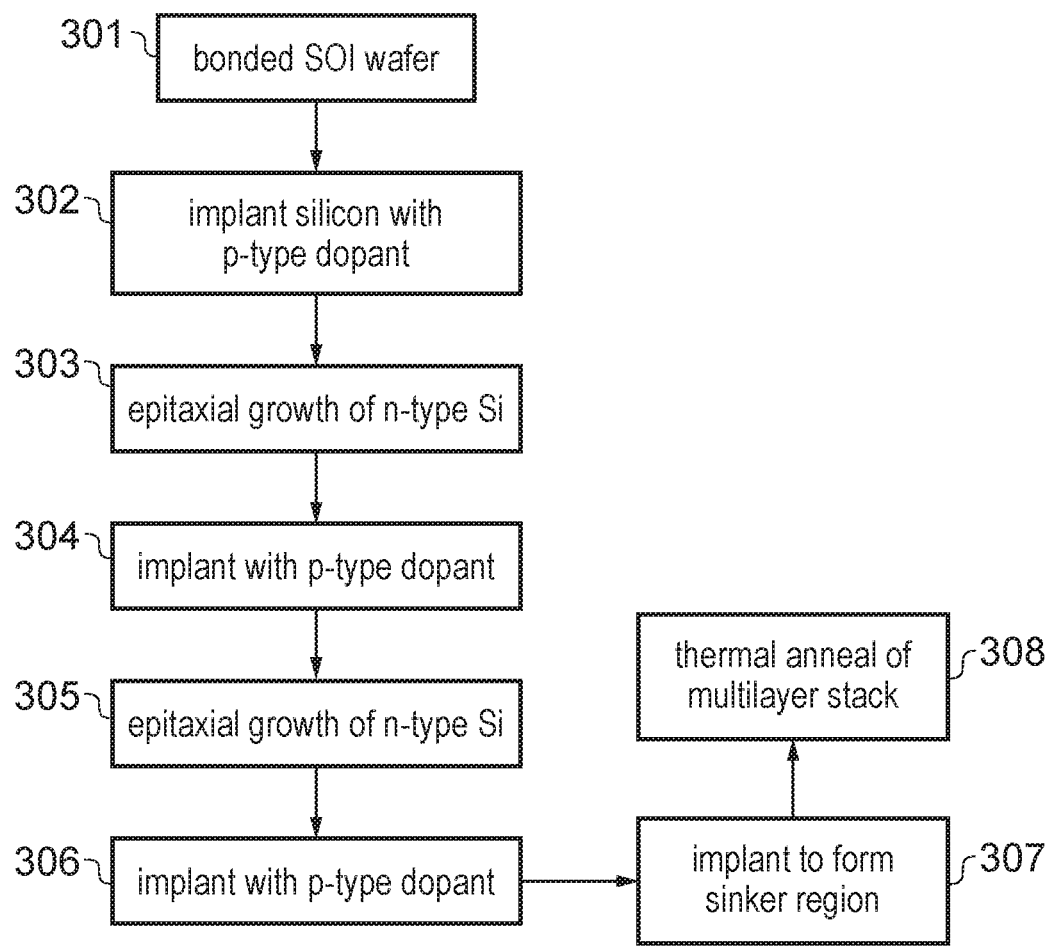
FIG. 3 is a process flow chart describing the steps in the method for fabricating a multilayer collector for a bipolar transistor according to an embodiment of this disclosure.

FIG. 2A indicates the first step in the fabrication process. A bonded silicon-on-oxide wafer 201 is used to provide the first p-type silicon layer 201a of the multi-layer collector (step 301). This silicon layer is then subjected to ion implantation such that it is implanted with a p-type dopant, such as boron, as shown in FIG. 2A (step 302). An n-type silicon layer 202 is then epitaxially grown over the layer 201a, as shown in FIG. 2B (step 303). The epitaxially grown n-type silicon layer 202 is then implanted with a p-type dopant, such as boron, as indicated in FIG. 2C (step 304) and forms the intermediate layer of the collector. A further n-type silicon layer 203 is then epitaxially grown directly over the doped intermediate layer 202, as indicated in FIG. 2D (step 305). The epitaxially grown n-type silicon layer 203 is then implanted with a p-type dopant, such as boron, as shown in FIG. 2E (step 306) and forms the doped uppermost layer or top layer of the collector. FIG. 2F shows a further ion implantation stage (step 307) for doping a portion of the multilayer collector stack for forming the sinker region 204. After this final implantation stage, the multilayer collector stack, as shown in FIG. 2G (step 307), is subjected to a thermal anneal to remove implantation damage and to allow for diffusion of the implanted dopants (step 308).

A trench structure 205, 206 is then formed adjacent the bulk collector region. This is followed by the formation of dielectric regions 207 using the conventional LOCOS process. These dielectric regions are formed such that there are portions of the upper surface of the collector, such as region 209 which is open between the dielectric regions. Open region 209 is used later in the fabrication process to define the intrinsic base region. A dielectric layer 210, preferably grown using the conventional TEOS process is deposited over other open regions such as 208 between the LOCOS defined dielectric regions. A portion of the dielectric layer over region 208 is removed later in the fabrication process to enable the formation of an electrical contact to the collector.

FIG. 2H(i) shows a cross-section of the trench structure comprising dielectrically isolated trenches 205 and 206, the trenches being formed adjacent opposite sides of the collector. Each trench is formed by vertically etching a silicon region adjacent the bulk collector region, up to the buried oxide layer of the silicon-on-oxide wafer. A dielectric layer 205a, 206a, preferably an oxide layer, is deposited on the sidewalls and the bottom portion of the trench to dielectrically isolate the trench from the bulk region of the collector. The trench is then filled with a doped semiconductor material 205b, 206b, preferably doped polysilicon. The upper surface of the trenches is covered with a dielectric layer, preferably an oxide layer.

FIG. 2H(ii) is another embodiment of the trench structure. In this embodiment, there is a further trench 212 formed in the silicon region surrounding the bulk collector region such that there is a region of silicon 211 between the trenches 205 and 212. The method used to form the trench 212 is same as the method described above for the formation of the trenches 205 and 206. The top of the trench is covered with a dielectric layer, preferably an oxide layer.

Figure 4:
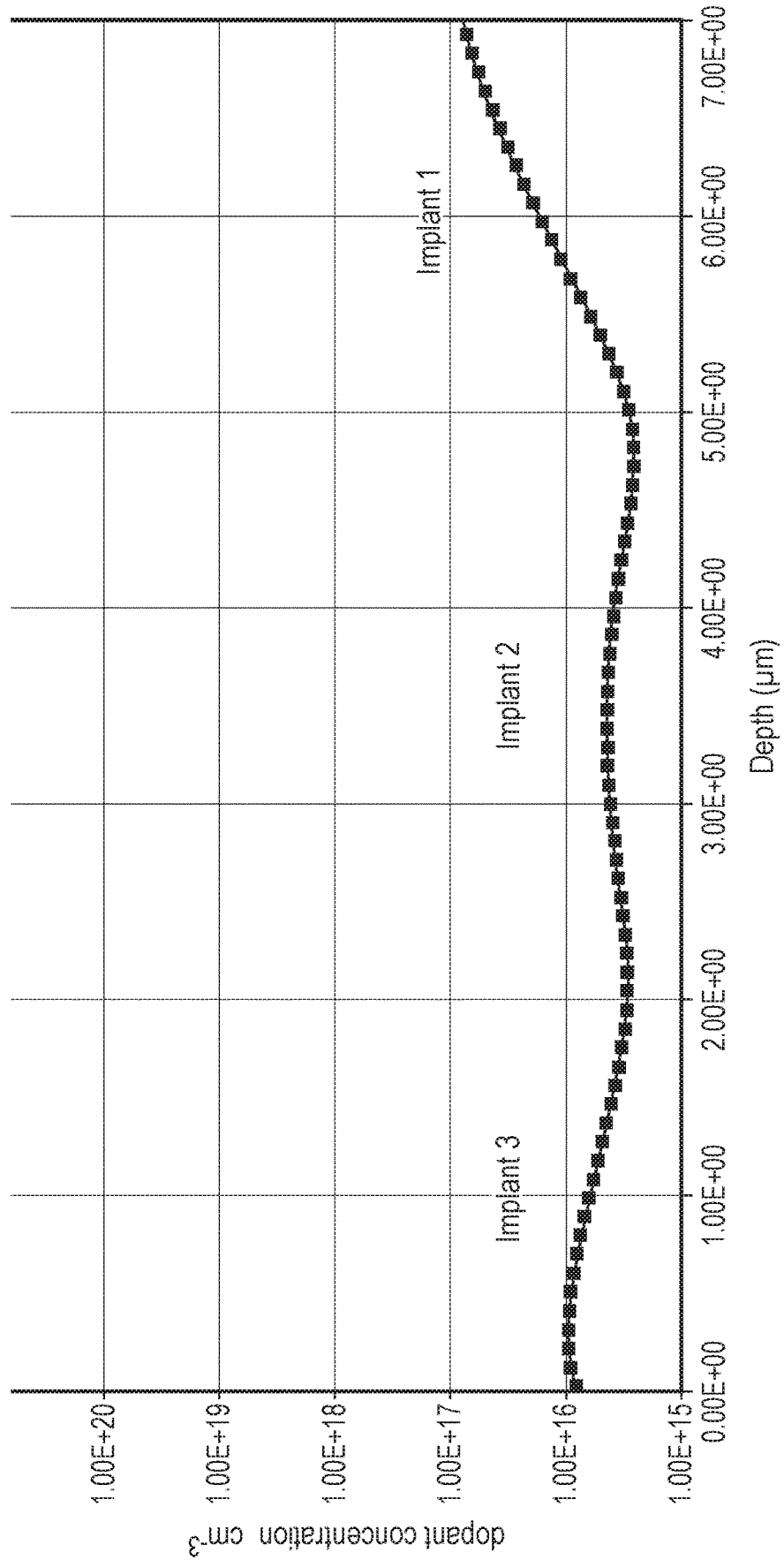
FIG. 4 is a secondary ion mass spectrometry graph of the dopant profile in a multilayer collector as a function the depth of the collector.

For a given thermal budget, the ratio of the thicknesses of the intermediate layer 202 of the collector to the top layer 203 of the collector can be adjusted to allow for the optimum merger of the dopant diffusivity rates to create an approximately uniform doping concentration profile as a function of depth in the multilayer collector. In practice, as seen in the example SIMS profile in FIG. 4, because of the separate dopant implants for each of the layers of the collector, the resultant dopant concentration profile as a function of depth of the collector, after the collector is exposed to a thermal anneal, will not be perfectly flat or uniform. In the example of FIG. 4, where the collector is fabricated using the process described in FIGS. 2 and 3, it is possible to identify three different dopant concentration profiles for the three different layers of the collector. In one embodiment, the ratio of the thickness of the n-type silicon intermediate layer and the n-type silicon top layer, each doped with a specific concentration of boron is 4.5:3.3 to create an approximately uniform doping profile as a function of depth in the multilayer collector. The thickness of each layer of the collector can have a tolerance of ±0.2 µm.

The thickness of the first p-type silicon layer 201a is adjusted to be 2.2 µm or greater to facilitate a high net boron content in this layer relative to the other layers of the collector. This allows connectivity to the sinker region to complete the current conduction path 116 in the bipolar transistor, as shown in FIG. 1. However, the inventors have also realised that the lattice stress associated with doping the first p-type layer 201a, typically with boron, accumulates with high dopant concentrations over extended areas. This results in the formation of lattice dislocation defects. In order to limit the formation of such defects, the thickness of the first p-type layer 201 is engineered to limit the overall maximum dopant concentration in the collector to approximately 1E18 cm$^{-3}$.

Figure 5A:
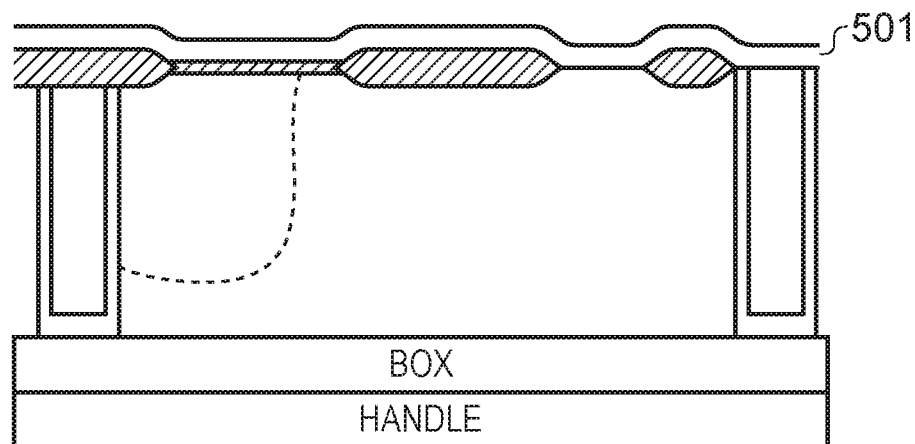
FIG. 5A is a schematic of the initial phase of the fabrication process of the bipolar junction transistor showing the deposition of a SiGe layer over the collector.
Figure 5B:
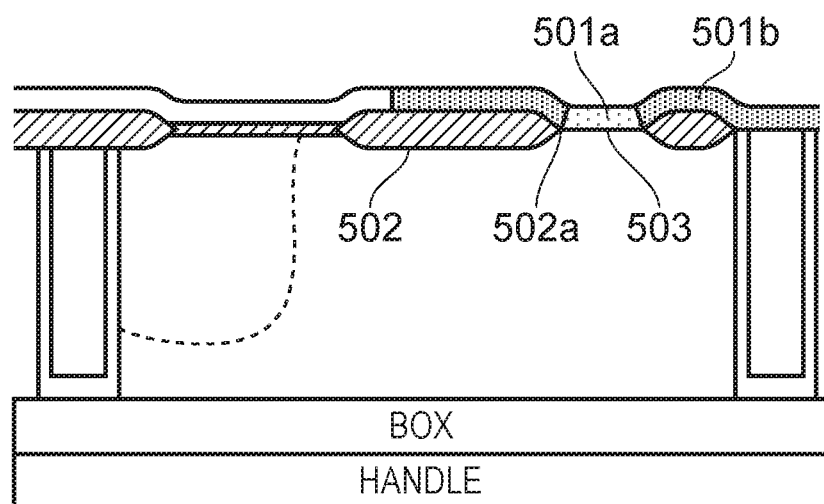
FIG. 5B shows the formation of the intrinsic and extrinsic base regions.

The next stage in the manufacturing process is to form the base and the emitter over the collector. This is shown in FIGS. 5A-5G and the flow chart in FIG. 6. A semiconductor layer 501, preferably SiGe layer, is first deposited over the upper surface of the collector structure as shown in the cross-section in FIG. 5A (step 601). This layer is then selectively doped with an n-type dopant to form the intrinsic base 501a and extrinsic base 502b regions as shown in FIG. 5B (step 602). The extrinsic base region has a higher dopant concentration than the intrinsic base region. The SiGe layer grows as polysilicon on the dielectric regions 502 and as crystalline SiGe over the open area 503 of the collector. The crystalline portion of the SiGe layer forms the intrinsic base 501a, whereas the polysilicon portion of the SiGe layer, on top of the dielectric regions 502, forms the extrinsic base 501b.

In use, particularly in high-frequency applications, the parasitic capacitance between base and the collector of the bipolar junction transistor becomes significant. It is desirable to reduce this capacitance to improve the speed of the bipolar junction transistor. This capacitance is directly proportional to the base-collector junction area and therefore, it is desirable to reduce this area. One way of reducing the base-collector junction area is to push the edge or bird's beak 502a of the dielectric layer 502 further into the open area 503 which also defines the area of the intrinsic base 501a. This can be achieved by tuning the thickness of the dielectric layer during the LOCOS process—that is, due to the nature of the formation of the dielectric layer 502 and the bird's beak 502a in the LOCOS process, increasing the thickness of the dielectric layer increases the extent of the bird's beak 502a into the open area 503 resulting in a reduction or narrowing of the open area 503.

Figure 5C:
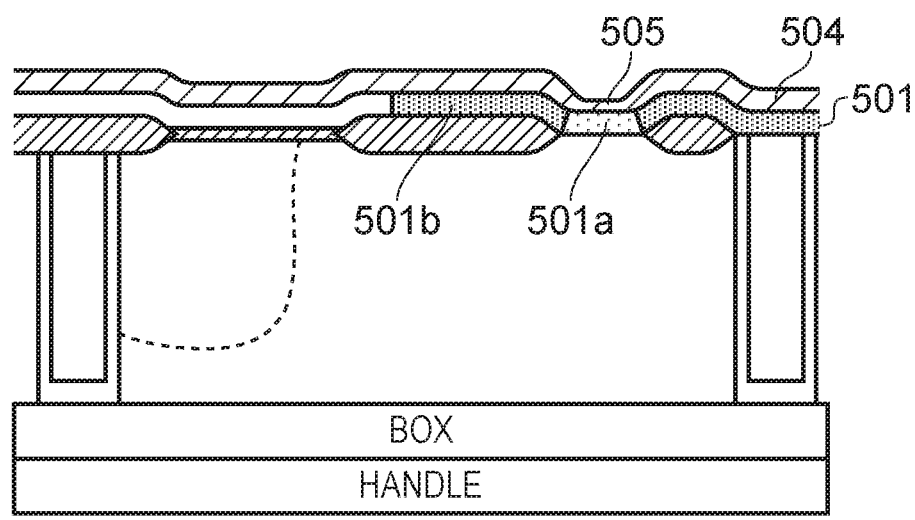
FIG. 5C shows the formation of an oxide layer over the base.
Figure 6:
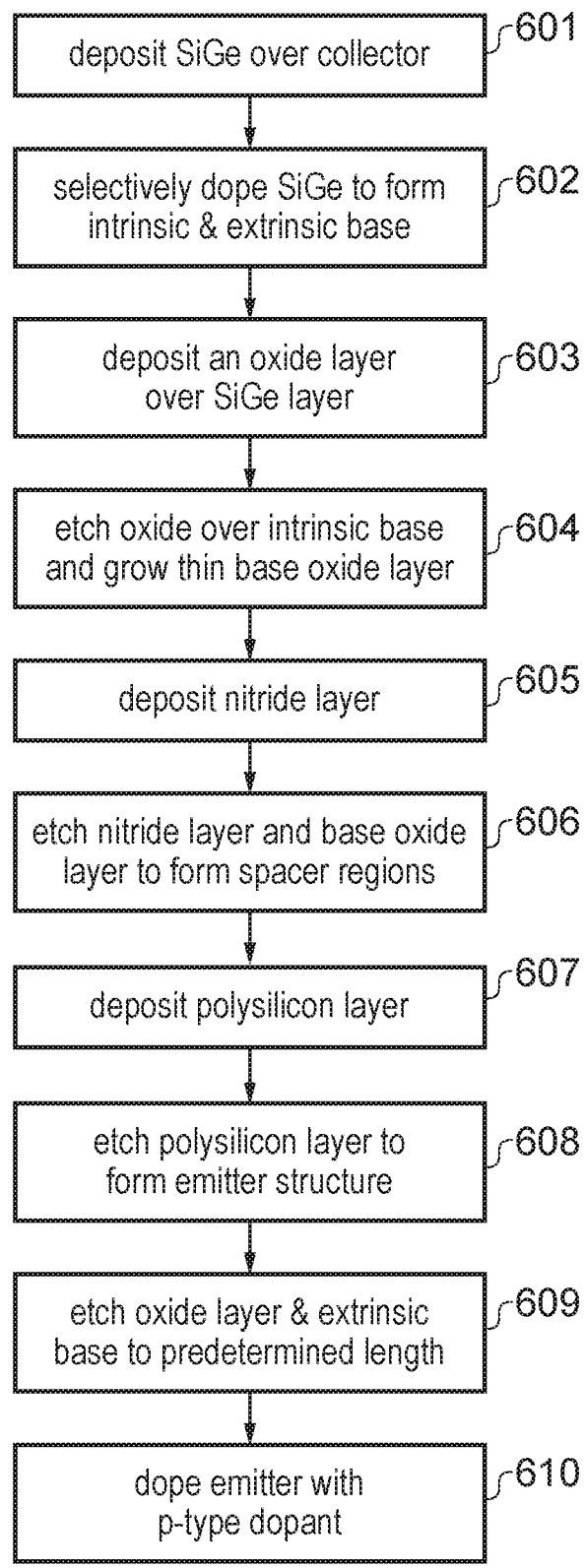
FIG. 6 is a process flow chart for the fabrication of a base and an emitter for a bipolar junction transistor according to an embodiment of this disclosure.

A dielectric layer, preferably an oxide layer 504 of a predetermined thickness, is then deposited, directly over the SiGe layer 501, as shown in FIG. 5C (step 603).

Figure 5D:
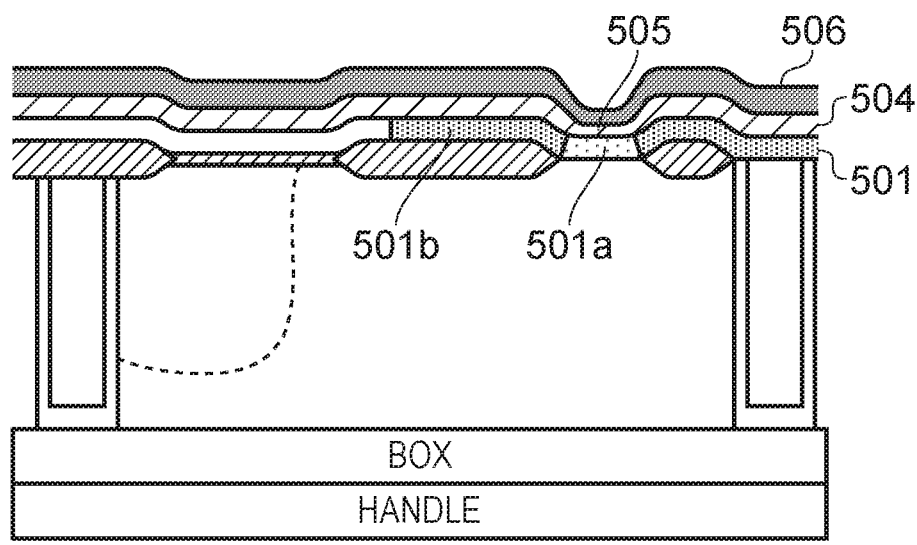
FIG. 5D shows the formation of a nitride layer over the oxide layer.
Figure 5E:
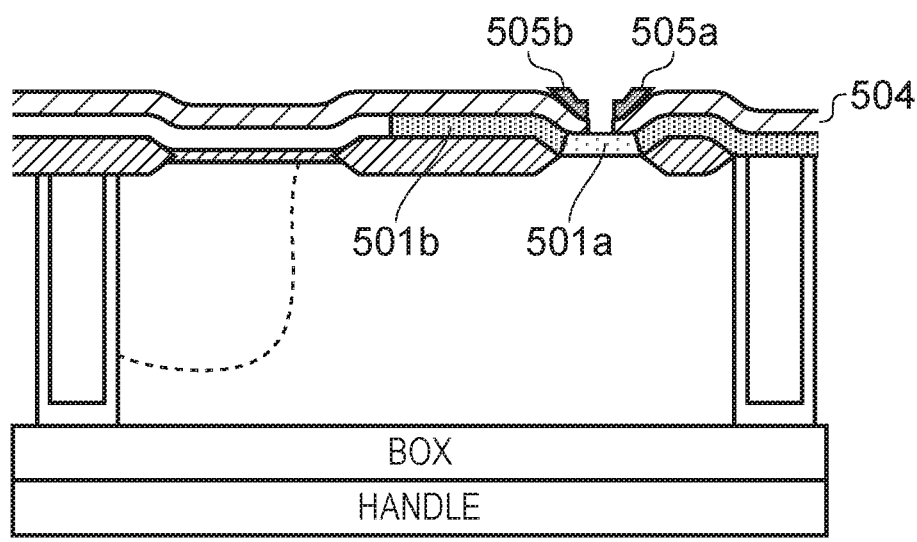
FIG. 5E shows the nitride layer etched to form spacer regions over the intrinsic base.

The dielectric layer 504 is selectively etched to expose the intrinsic base region 501a and a thin dielectric layer 505, preferably an oxide layer, thinner than the dielectric layer 504, is grown over the intrinsic base region 501a as shown in FIG. 5C (step 604). This is followed by the deposition of another dielectric layer 506, preferably a nitride layer, across the wafer, directly over the layers 504 and 505, as shown in FIG. 5D (step 605). The layers 505 and 506 are then subsequently etched to define spacer regions 505a and 505b over the intrinsic base region 501a, as shown in FIG. 5E (step 606). In some embodiments, the spacer regions can be L-shaped. These spacer regions will later be used to separate the edges of the emitter from the intrinsic base as will be explained below.

Figure 5F:
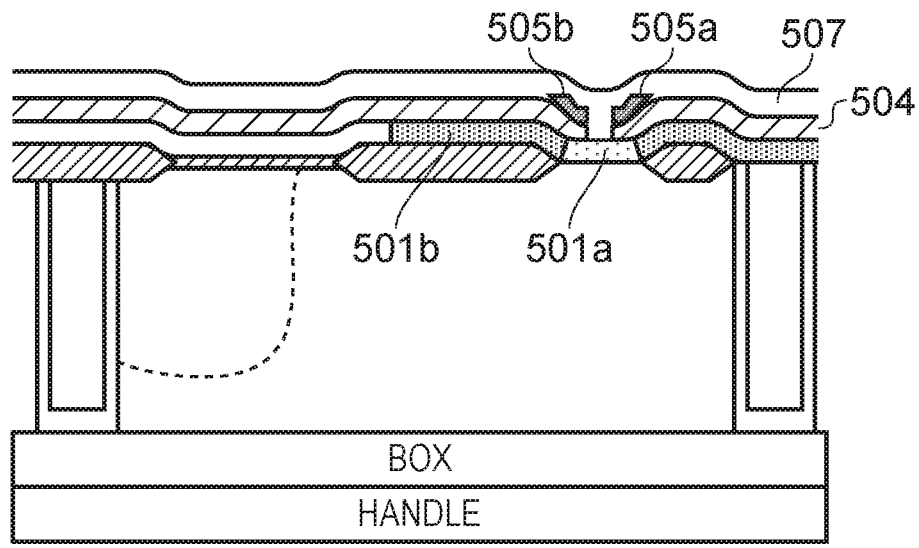
FIG. 5F shows the formation of a polysilicon layer over the oxide layer and the spacer regions.
Figure 5G:
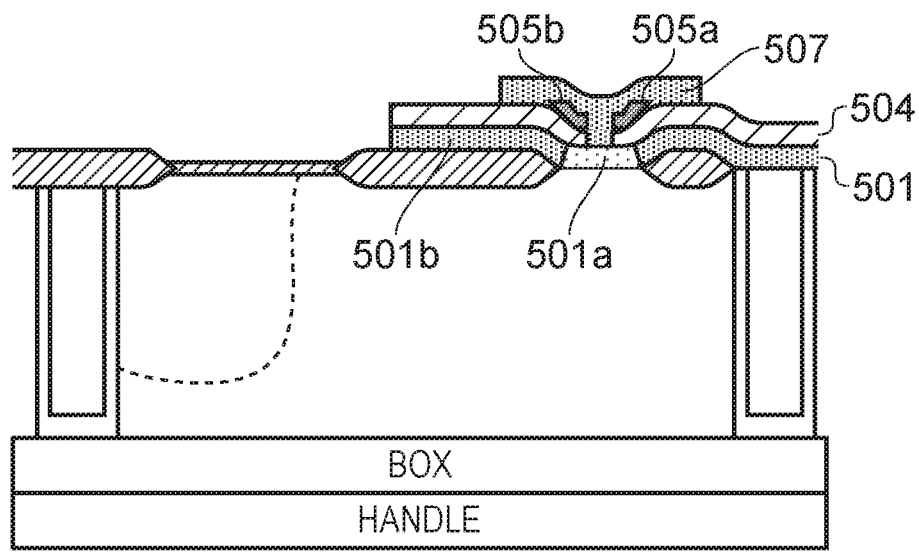
FIG. 5G shows the polysilicon layer etched and doped to form the emitter.

A polysilicon layer 507 is then deposited as shown as shown in FIG. 5F (step 607). This polysilicon layer is etched (step 608) and doped with a p-type dopant to form the emitter (step 610), as shown in FIG. 5G. The extrinsic base 501b and the oxide layer 504 are also etched to a predetermined length as shown in FIG. 5G (step 609).

Figure 7:
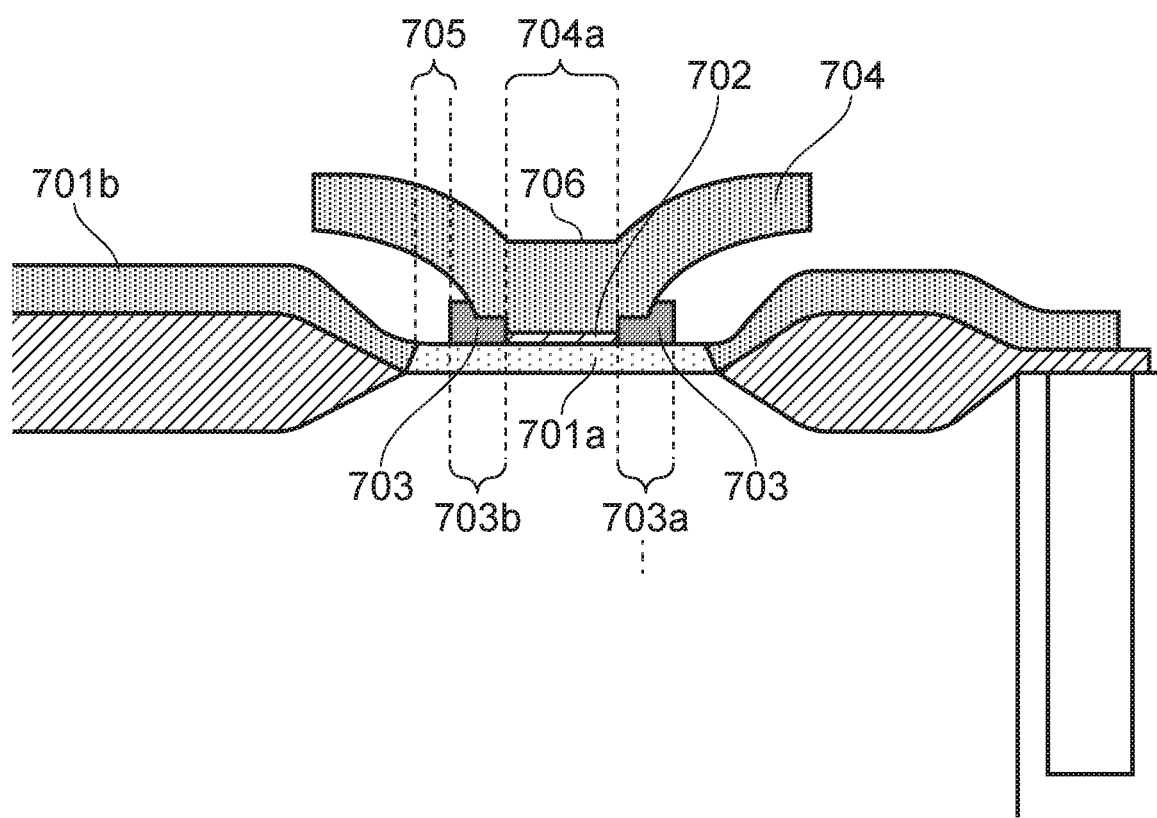
FIG. 7 is a cross-section schematic of a portion of a bipolar junction transistor showing details of the emitter and the base.

FIG. 7 shows a cross-section view of a portion of the bipolar junction transistor with the emitter 704 being formed above the substantially planar upper surface of the intrinsic base region 701a. The emitter 704 is an epitaxially grown p-type polysilicon emitter for a PNP transistor. The emitter 704 is not etched or recessed into the base 701a. The emitter is physically separated from the intrinsic base 701a by an interfacial oxide (IFO) layer 702 which is formed as a result of the epitaxial growth of the polysilicon emitter layer over the intrinsic base 701a. The thickness of the interfacial oxide layer 702 and the height of the emitter 704 can be configured to optimise a gain of the bipolar junction transistor. The height of the emitter can be defined as the distance between the IFO/SiGe interface to the surface (in this case 706) of the emitter polysilicon layer for contacting the metal via for the emitter contact. The height of the emitter can be configured to be at least 300 nm for a PNP bipolar junction transistor. The thickness of the IFO layer 702 can be optimized to be approximately 500 pm for a PNP bipolar junction transistor.

FIG. 7 also shows L-shaped spacer regions 703 at the edges of the emitter 704 above the intrinsic base 701a. These spacer regions can be formed of an oxide and/or a nitride layer. The spacer regions can be configured to define a width of a region of the emitter adjacent the intrinsic base. In FIG. 7, the length 703a, 703b of the L-shaped spacer regions 703, can be controlled to define the width of the emitter 704a adjacent the intrinsic base 701a. The spacer regions can be configured to narrow the width 704a of the emitter adjacent the intrinsic base region to 400 nm or less. In this way, the use of spacer regions overcomes the limitations of an emitter structure that is defined by lithography where the width of the emitter adjacent the intrinsic base can be no less than 600 nm. By narrowing the width of the emitter adjacent the intrinsic base, the parasitic emitter-base capacitance defined by the emitter-base junction area is reduced, thereby improving the efficiency of the emitter and the speed of the bipolar junction transistor.

The total distance 705 and 703b, that is the distance between the crystalline-polycrystalline transition of the SiGe layer and an edge of the emitter 704, can also be optimised for a desired speed of the bipolar junction transistor. For a PNP transistor, this distance is 0.55 µm or less. For an NPN transistor, this distance is 0.4 µm or less.

PNP and NPN transistors can be fabricated in a complementary bipolar fabrication process, that is, both type of devices can be fabricated on a single substrate. The inventors have realised that even in a complementary fabrication process, the characteristics of the emitter can be customised for optimum performance for a given type of transistor.

A method of fabricating PNP and NPN transistors with emitter region customised for each transistor type will now be described with reference to FIGS. 8A to 8M and the process flow chart in FIG. 9.

Figure 8A:
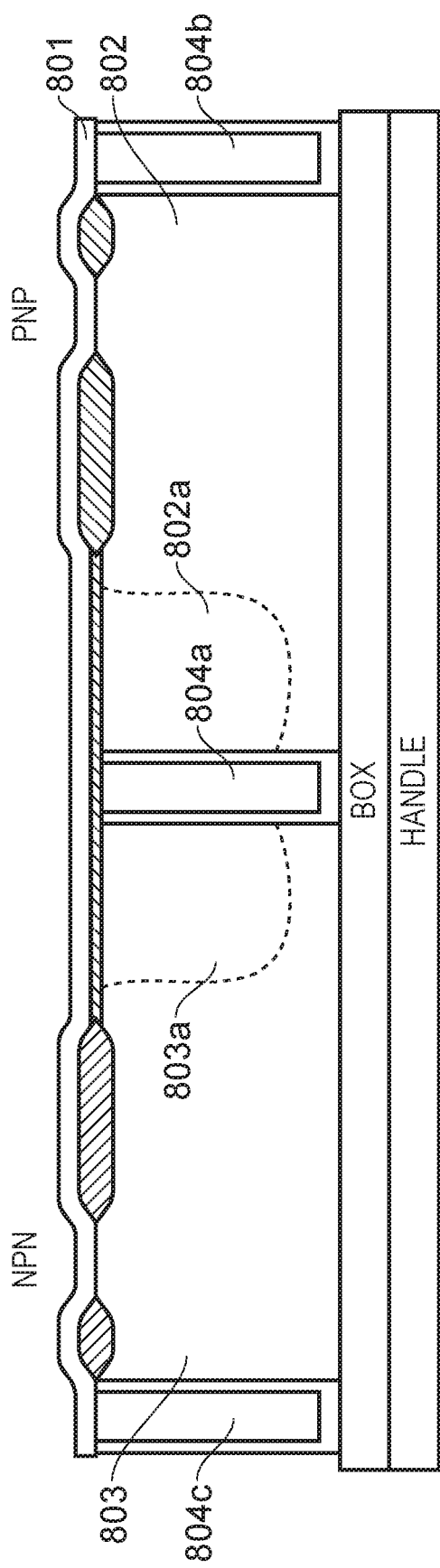
FIG. 8A is a schematic of the initial phase of the complementary bipolar junction transistor fabrication process showing the deposition of a SiGe layer over the upper surface of the NPN and PNP collectors.
Figure 9:
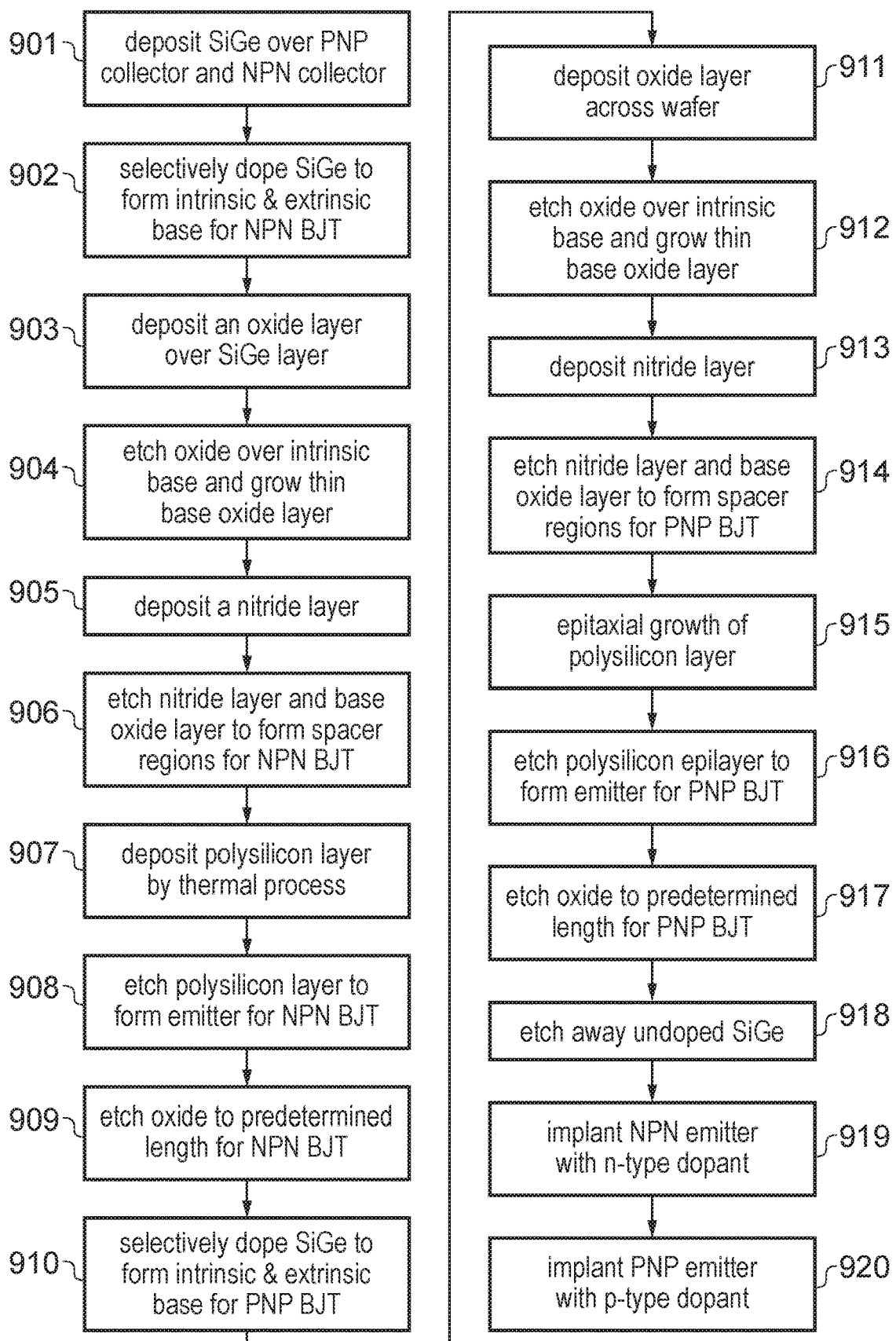
FIG. 9 is a process flow chart for the complementary bipolar fabrication process according to an embodiment of this disclosure.

FIG. 8A shows a cross section of the collector 802 for a PNP transistor and the collector 803 for an NPN transistor formed as part of a complementary bipolar fabrication process. A semiconductor layer 801, preferably a SiGe layer, is first blanket deposited across the wafer, over the upper surface of the collector 802 of the PNP transistor and the upper surface of the collector 803 of the NPN transistor, as shown in the cross-section in FIG. 8A (step 901).

The collector 802 for the PNP transistor can be a multilayer collector and can be fabricated using the process as described earlier in FIGS. 2A to 2G and FIG. 3. The collector for the NPN transistor can also be a multilayer collector and can comprise of the same epitaxial layers as the PNP transistor. However, in this case, the layers for the collector of the NPN transistor are not subject to the dopant implantation stages as the layers for the collector of the PNP transistor. This is because the multilayer stack already comprises n-type epitaxial layers which can be used for the n-type collector of the NPN transistor. The collector for the NPN transistor comprises a highly doped n-type sinker region (803a) similar to the highly doped p-type sinker region (802a) in the collector for the PNP transistor. The bulk collector region 802 for the PNP transistor is isolated from the bulk collector region 803 for the NPN transistor by means of a trench structure 804a, as shown in FIG. 8A. Trench structure 804b is dielectrically isolated from a side of the collector for the PNP transistor, as shown in FIG. 8A. Similarly, trench structure 804c is dielectrically isolated from a side of the collector for the NPN transistor, as also shown in FIG. 8A. The trench structures 804a, 804b and 804c are formed similarly to the process described earlier in relation to FIG. 2H(i).

Figure 8B:
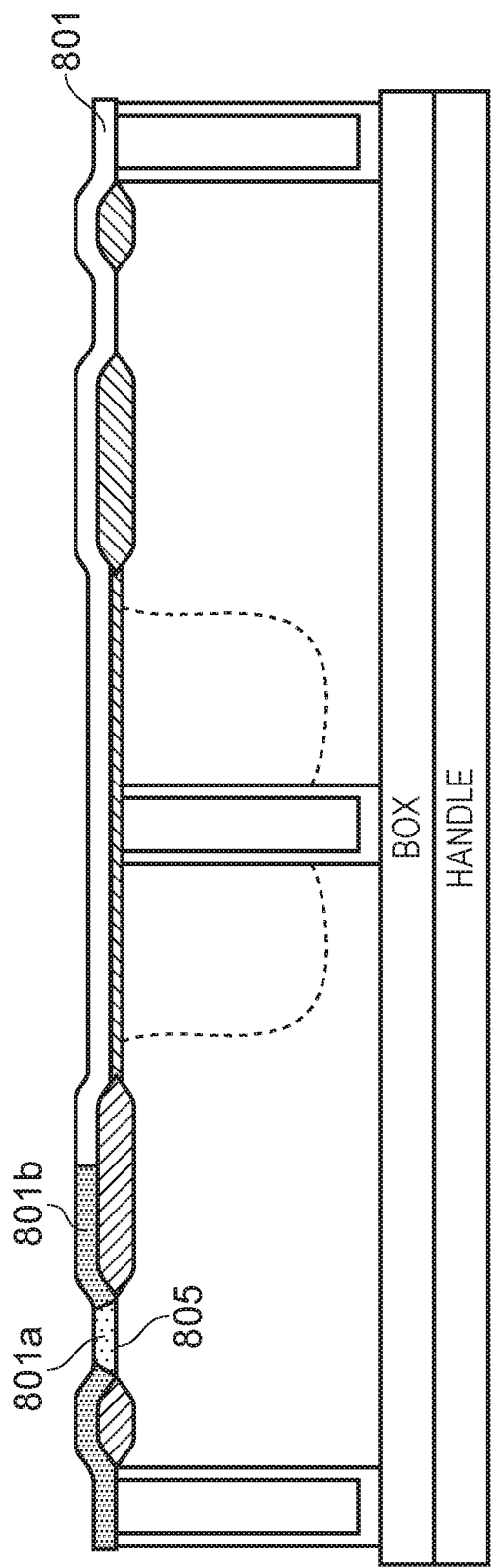
FIG. 8B shows the formation of the intrinsic and extrinsic base regions for the NPN bipolar junction transistor.

After the deposition of the SiGe layer 801, a portion of the layer 801 is then selectively doped with a p-type dopant to form the intrinsic base 801a and the extrinsic base 801b regions for the NPN transistor, as shown in FIG. 8B (step 902). This process of forming the intrinsic and extrinsic base regions is similar to the process described earlier, in relation to FIG. 5B.

Figure 8C:
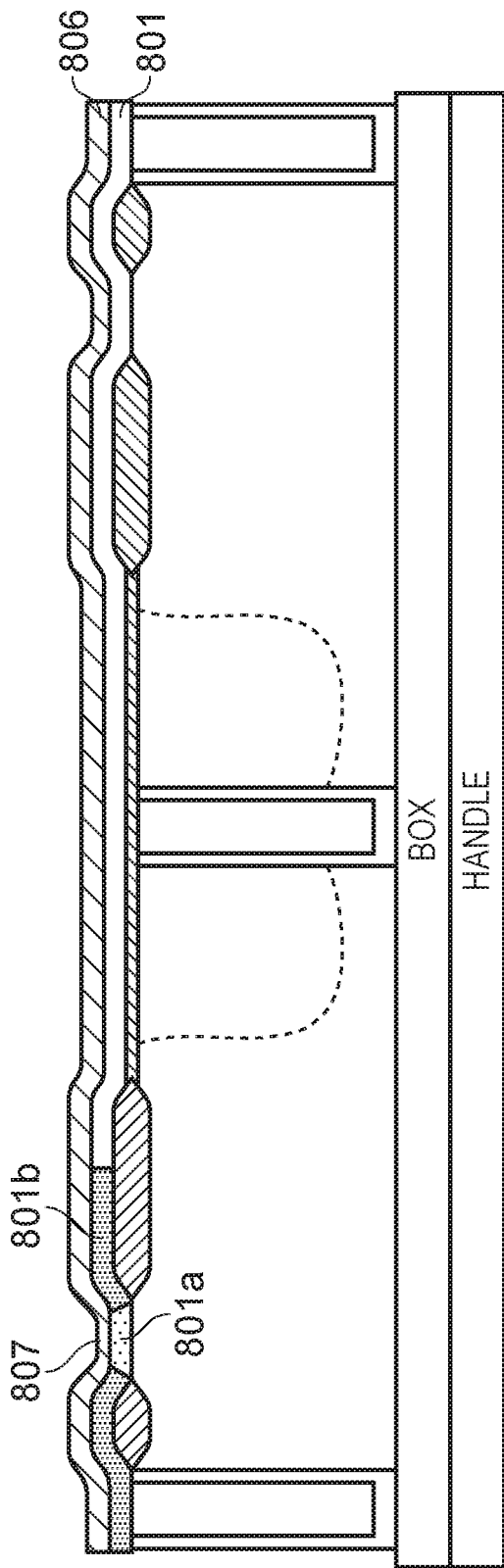
FIG. 8C shows the formation of an oxide layer over the SiGe layer.
Figure 8D:
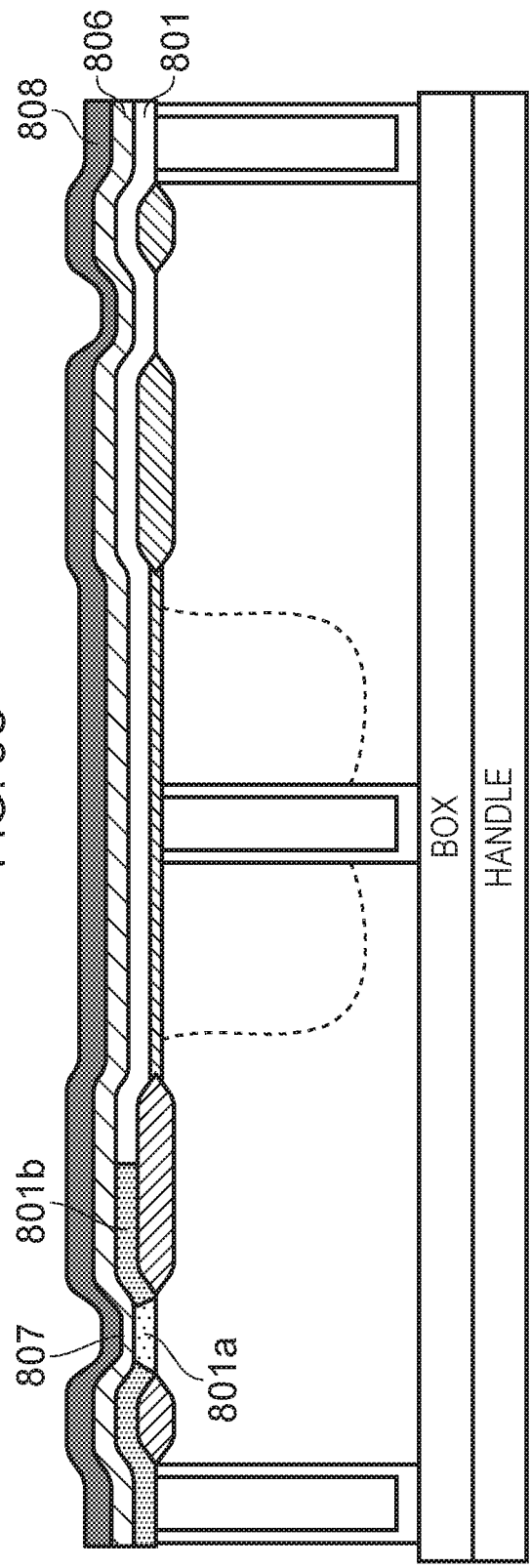
FIG. 8D shows the formation of a nitride layer over the oxide layer.
Figure 8E:
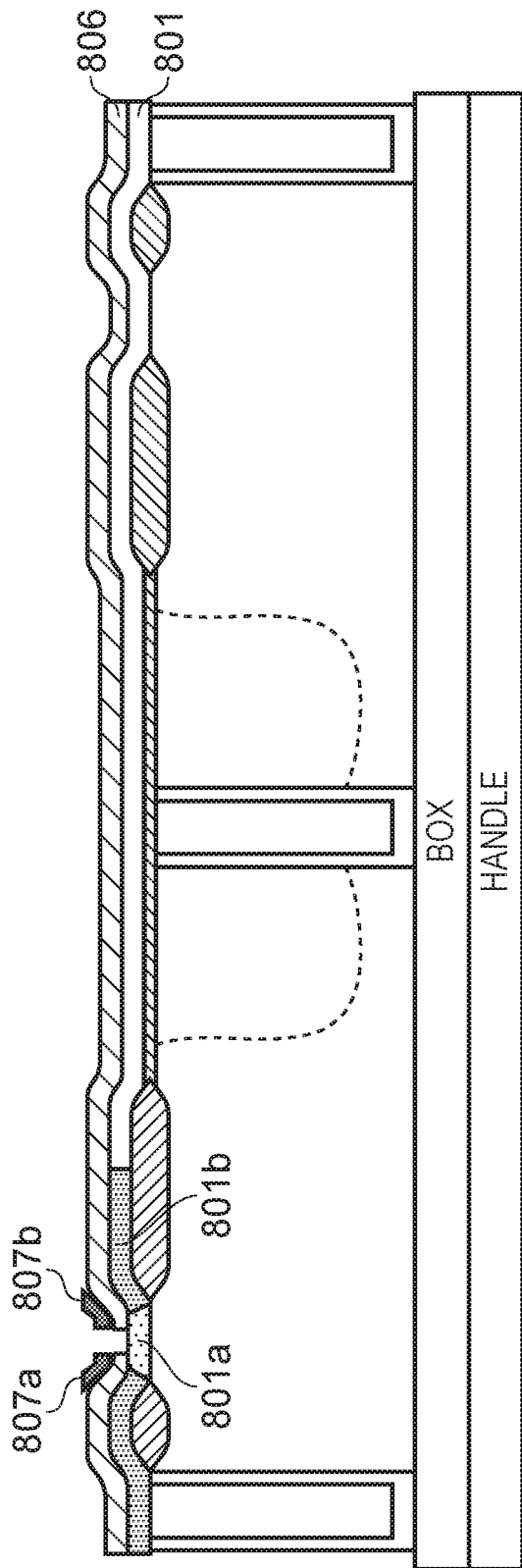
FIG. 8E shows the nitride layer etched to form spacer regions over the intrinsic base for the NPN bipolar junction transistor.

A dielectric layer, preferably an oxide layer 806 is then blanket deposited across the wafer, over the semiconductor layer 801, as shown in FIG. 8C (step 903). The dielectric layer 806 is selectively etched to expose the intrinsic base region 801a for the NPN transistor and a thin dielectric layer 807, thinner than the dielectric layer 806, is grown over the intrinsic base region 801a as shown in FIG. 8C (step 904). This is followed by the blanket deposition of another dielectric layer 808, preferably a nitride layer 808 across the wafer, over the dielectric layers 806 and 807, as shown in FIG. 8D (step 905). The layers 807 and 808 are then subsequently etched to form spacer regions 807a, 807b over the intrinsic base region 801a for the NPN transistor, as shown in FIG. 8E (step 906). The spacer regions 807a and 807b can be configured similarly to spacer regions 703 in FIG. 7 for adjusting the parasitic emitter-base capacitance.

Figure 8F:
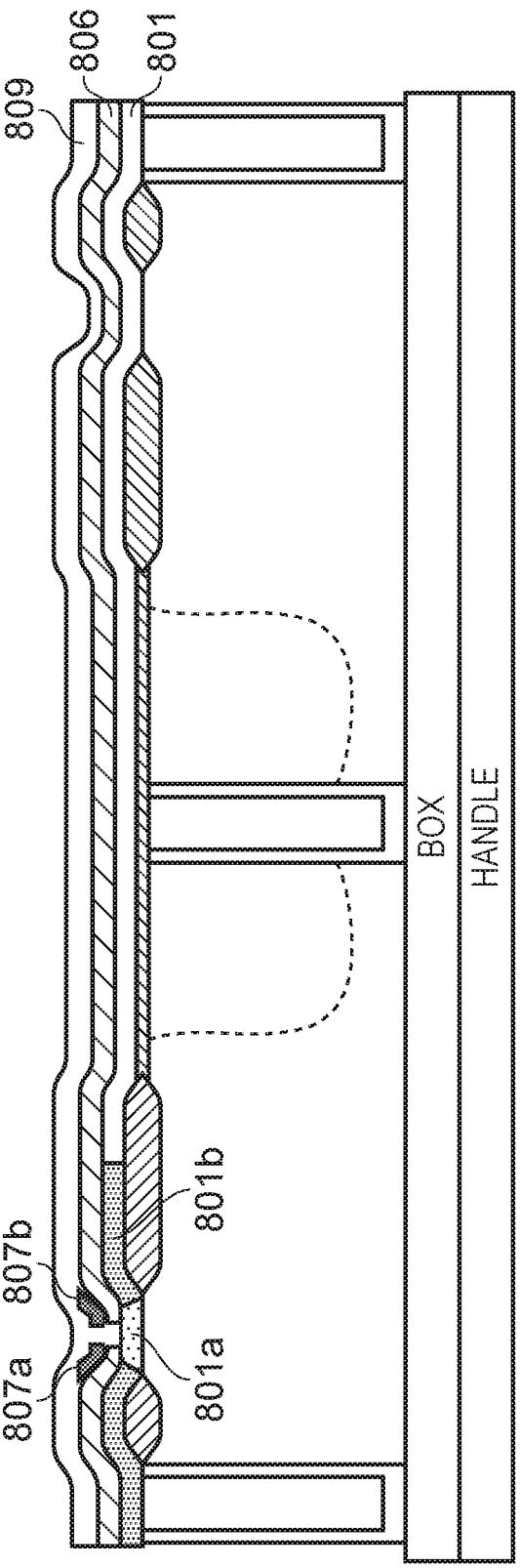
FIG. 8F shows the formation of a thermally deposited polysilicon layer over the oxide layer and the spacer regions.

A polysilicon layer 809 is then thermally grown across the wafer, over the dielectric layer 806 and the spacer regions 807a and 807b, as shown in FIG. 8F (step 907). The polysilicon layer 809 is then etched to form the emitter structure for the NPN transistor as shown in FIG. 8G (step 908). The oxide layer 806 is also etched to a predetermined length as shown in FIG. 8G (step 909). The height of the emitter can be configured to be between 150 nm to 180 nm for an NPN transistor. As already described above in relation to FIG. 7, the height of the emitter can be defined as the distance between the IFO/SiGe interface to the surface of the emitter polysilicon layer (in this case 809a) for contacting the metal via for the emitter contact. In the absence of an interfacial layer or where the thickness of the interfacial layer is reduced to a minimum (less than 500 pm), the height of the emitter can be defined as the distance between the emitter polysilicon layer/SiGe interface to the surface of the emitter polysilicon layer for contacting the metal via for the emitter contact.

A portion of the layer 801 is then selectively doped with an n-type dopant to form the intrinsic base 801c and the extrinsic base 801d regions for the PNP transistor, as shown in FIG. 8H (step 910). This process of forming the intrinsic and extrinsic base regions is similar to the process described earlier, in relation to FIG. 5B.

A dielectric layer, preferably an oxide layer 810 is then blanket deposited across the wafer, over the semiconductor layer 801 and over the emitter structure 809 for the NPN transistor, as shown in FIG. 8I (step 911). The dielectric layer 810 is selectively etched to expose the intrinsic base region 801c for the PNP transistor and a thin dielectric layer 811, thinner than the dielectric layer 810, is grown over the intrinsic base region 801c as shown in FIG. 8I (step 912). This is followed by the blanket deposition of another dielectric layer 812, preferably a nitride layer, across the wafer, over the dielectric layers 810 and 811, as shown in FIG. 8J (step 913). The layers 811 and 812 are subsequently etched to form spacer regions 811a, 811b over the intrinsic base region 801c for the PNP transistor, as shown in FIG. 8K (step 914). The spacer regions 811a and 811b can be configured similarly to spacer regions 703 in FIG. 7 for adjusting the parasitic emitter-base capacitance.

A polysilicon layer 813 is then epitaxially grown across the wafer, over the dielectric layer 809 and the spacer regions 810a, 810b as shown in FIG. 8L (step 915). The polysilicon layer 813 is then etched to form the emitter structure for the PNP transistor as shown in FIG. 8M (step 916). The oxide layer 809 is also etched to a predetermined length as shown in FIG. 8M (step 917). FIG. 8M also shows that the undoped SiGe layer between the extrinsic base region for the NPN transistor and the extrinsic base region for the PNP transistor is completely etched away (step 918). The emitter structure 808 for the NPN transistor is implanted with an n-type dopant (step 919) and the emitter structure 813 for the PNP transistor is doped with a p-type dopant (step 920) as shown in FIG. 8M.

The height of the emitter can be configured to be at least 300 nm for a PNP bipolar junction transistor. The thickness of an IFO layer (not shown), formed as a result of the epitaxial growth of the polysilicon layer 813 over the intrinsic base region 801*c*, can be optimized to be approximately 500 pm for a PNP bipolar junction transistor.

The complementary bipolar fabrication process described above enables the emitter structure for the NPN transistor to be defined separately to that of the PNP transistor. As mentioned before, the thickness of the interfacial oxide layer and the height of the emitter can be configured to optimise the performance, in particular, the gain, for a given type of transistor. In the process described above, the emitter layer for the NPN transistor is grown in a thermal furnace as opposed to the epitaxially grown emitter layer for the PNP transistor.

The inventors have realised that for an NPN transistor, the interfacial oxide thickness needs to be minimised to reduce emitter resistance and noise. The minimisation of interfacial oxide growth is achieved by growing the polysilicon emitter layer for the NPN transistor in a thermal furnace.

The inventors have also realised that the average grain size for the polysilicon crystals in the emitter can be used to optimise the gain for a given type of transistor. That is, the grain size of the polysilicon crystals in the emitter can be used to control parameters such as carrier lifetime and the recombination rate of injected carriers from the base to the emitter. Taking into account these parameters, the inventors have realised that the average grain size of the polysilicon crystals in the emitter for the NPN transistor has to be smaller than the average grain size of the polysilicon crystals in the emitter for the PNP transistor. The growth of the polysilicon emitter in a thermal furnace produces a smaller average grain size for the polysilicon crystals in the emitter for the NPN transistor when compared to the epitaxially grown emitter for the PNP transistor. For the NPN transistor, a smaller average grain size for the polysilicon crystals advantageously decreases the gradient of carriers injected from the base transistor and thereby decreases the injected base current.

In use, the emitter-base junction of the transistor is forward biased whereas the collector-base junction is reversed biased. A common problem in conventional bipolar junction transistors is the dependence of collector current on collector-base voltage, also known as the Early effect. Applying a reverse-bias voltage across the collector-base junction results in a depletion region that spreads across the base-collector interface, into the bulk collector region below the base. The depletion region comprises ionised acceptor atoms in the collector. The charge as a result of the ionised acceptor atoms in the collector is balanced by an equal but opposite charge of ionised donor atoms in the base to balance the net electric field. As the collector voltage is increased, the width of the depletion region increases which in turn reduces the effective width of the base. A reduction in the effective base width results in an increase in collector current due to an increase in diffusion current through the base. It is desirable to reduce this modulation of base-width and hence the dependency of collector current on the collector voltage.

One way of solving this problem is to reduce the coupling of the charge of the ionised acceptor atoms to the base and instead couple this charge to a charge control structure adjacent the collector-base space charge region. This reduces the amount of ionised donor atoms in the base to balance the net electric field, thereby reducing the modulation of base-width with the collector voltage.

Figure 10:
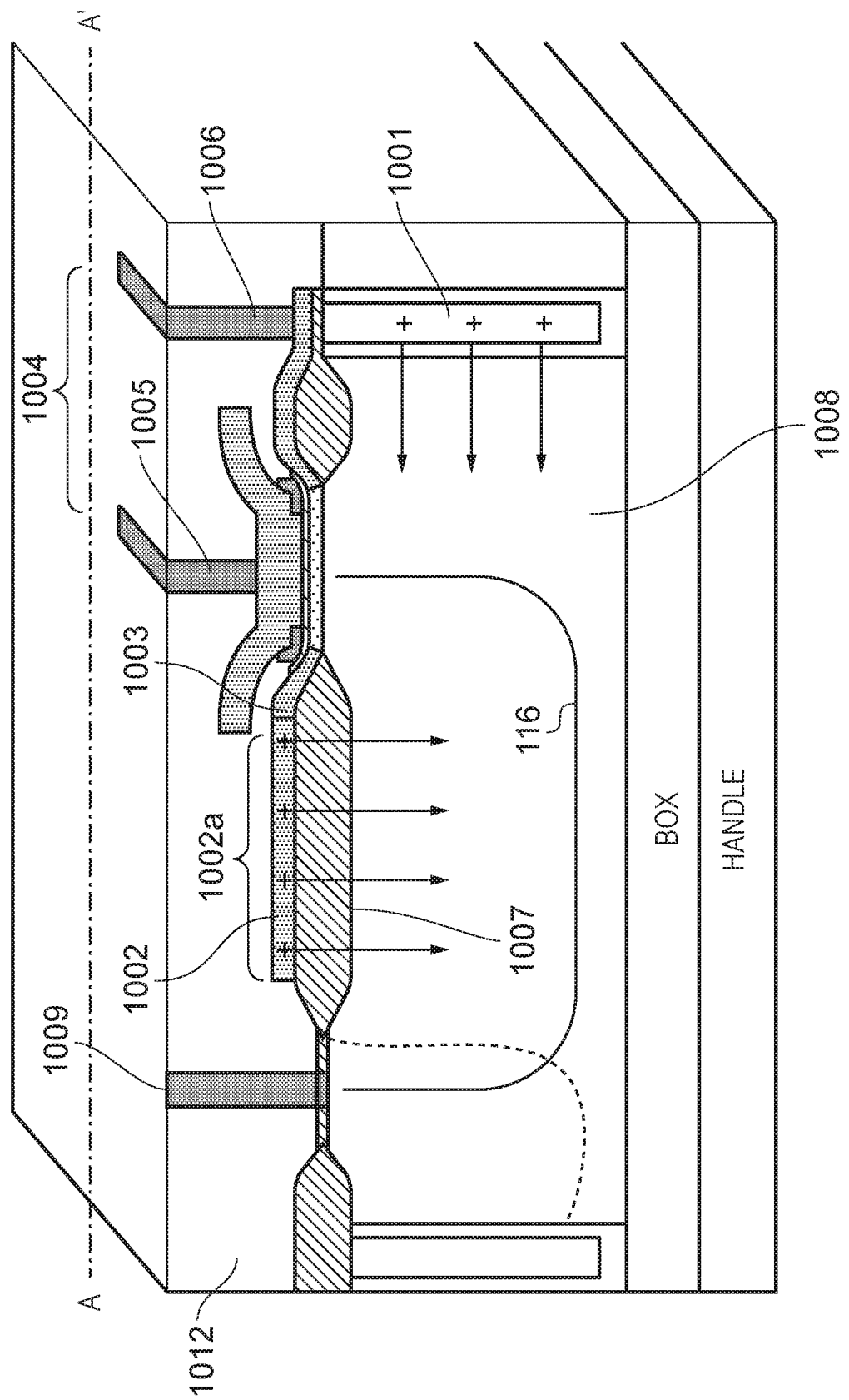
FIG. 10 is a cross-section schematic of a bipolar junction transistor with a charge control structure according to an embodiment of this disclosure.
Figure 10I:
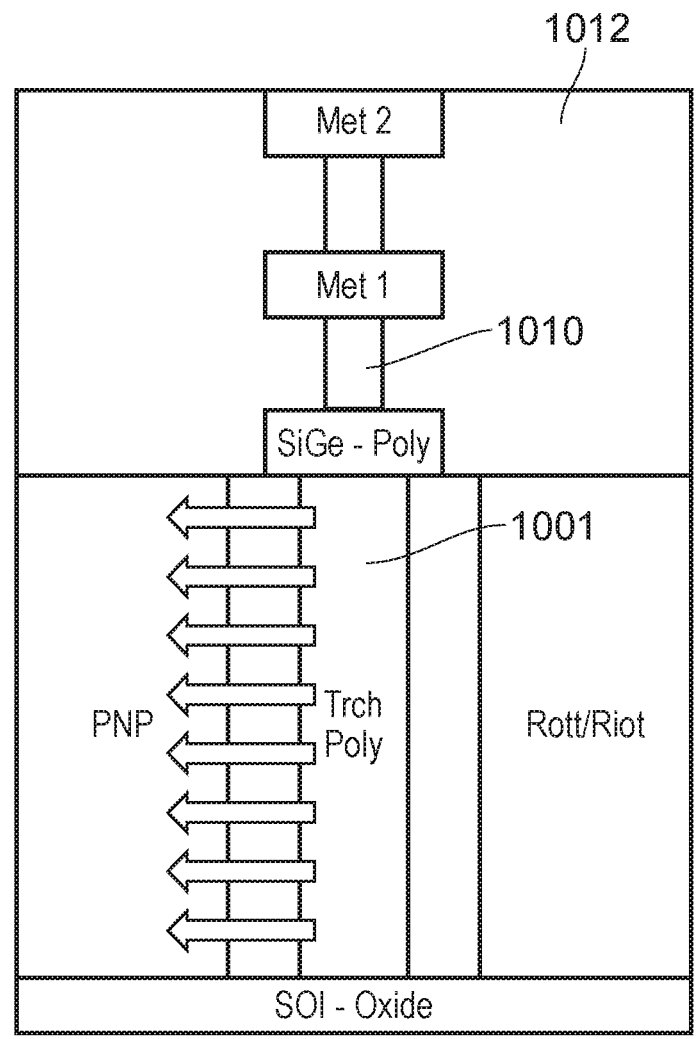
FIG. 10(i) is a cross-section schematic showing the electrical connections to control the potential of the charge control structure of FIG. 10.

FIG. 10 shows an embodiment comprising a transistor with a charge control structure for coupling the charge of the ionised acceptor atoms vertically to the trench 1001 at a fixed potential and laterally to the field plate 1002 which is held at a potential equal to the base potential. The trench 1001 is part of the trench structure of the embodiment shown in FIG. 2H(i). The trench is aligned directly under the base contact to allow the trench to be placed as close as possible to the region of the collector which lies under the vertical conduction path of the current conduction path 116 of the transistor. In this embodiment, the field plate 1002 is contiguous with the extrinsic portion 1003 of the base and is formed of the same doped semiconductor material as the extrinsic base. The field plate 1002 extends laterally over the insulating region 1007 towards the sinker region of the collector. The lateral length 1002*a* of the field plate 1002 can be greater than the lateral distance 1004 between the emitter contact 1005 and the base contact 1006. The field plate 1002 is formed simultaneously as the base layer using the method explained above in relation to FIGS. 5A and 5B. The use of a multilayer collector 1008 together with the charge control structure further improves the charge control mechanism. As discussed earlier, the multilayer collector can be constructed to create an approximately uniform doping concentration profile as a function of depth in the collector. This ensures that the depletion region spread as a result of using the charge control structure is enabled as per design for a target breakdown voltage.

FIG. 10(*i*) shows a part of a cross section of the transistor through the line A-A' in FIG. 10. In FIG. 10(*i*), an electrical contact to the trench 1001 is made using a metal via 1010 that extends through an aperture in the insulating layers 1012 to contact a doped semiconductor material, preferably SiGe, deposited directly above the upper surface of the trench. This doped semiconductor material is deposited on a portion of the upper surface of the trench after removing the oxide above that portion.

Figure 11:
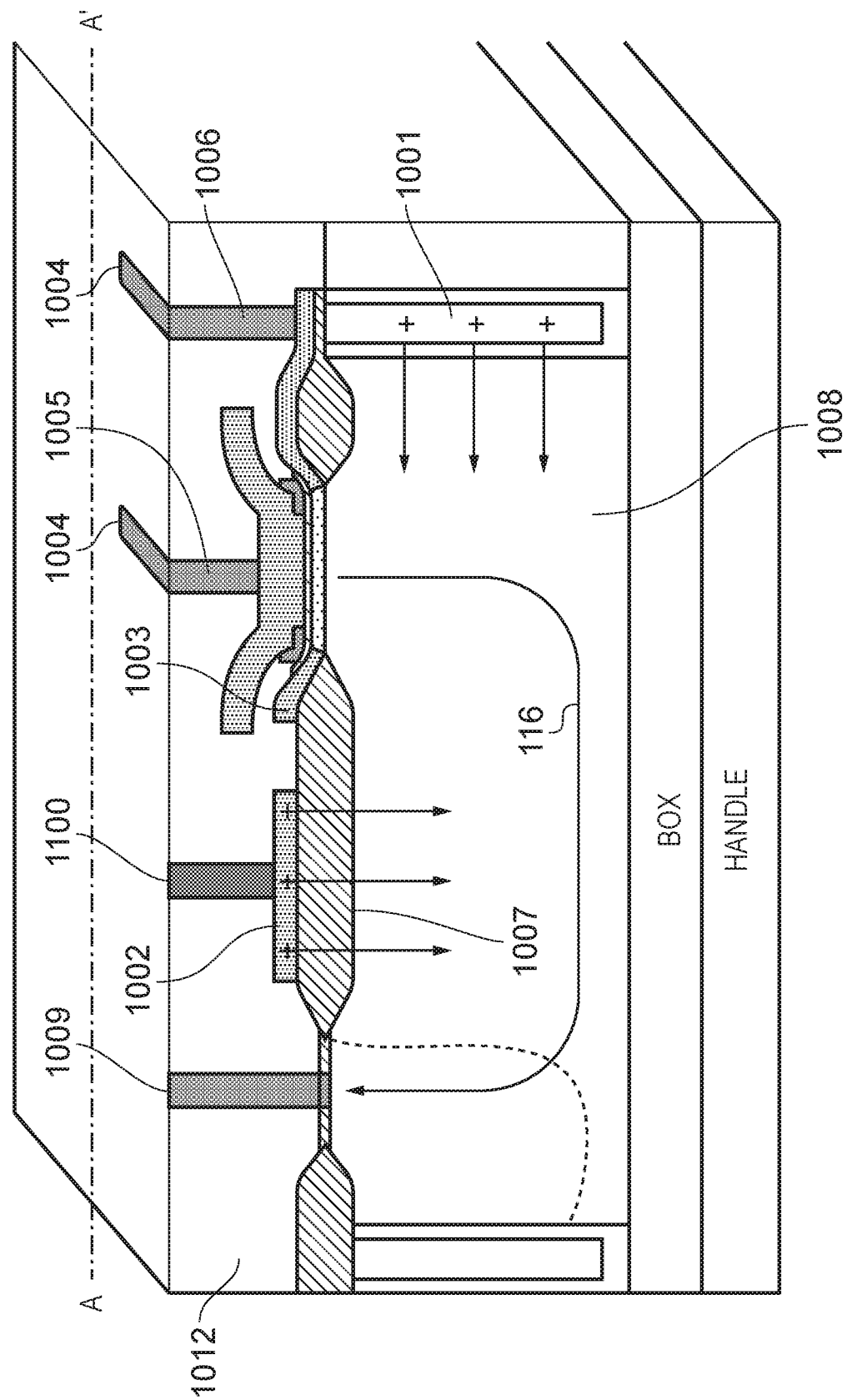
FIG. 11 is a cross-section schematic of a bipolar junction transistor with a charge control structure according to another embodiment of this disclosure.

FIG. 11 shows another embodiment of the charge control structure. In this embodiment, the field plate 1002 is formed of the same doped semiconductor material as the extrinsic base 1003 but is not contiguous with the extrinsic base. The field plate 1002 is held at a potential which is fixed and is separate from the potential at the base. An electrical contact is made to the field plate by extending a metal via 1100 through the insulating layers 1012 to contact the doped semiconductor material of the field plate 1002.

Figure 12:
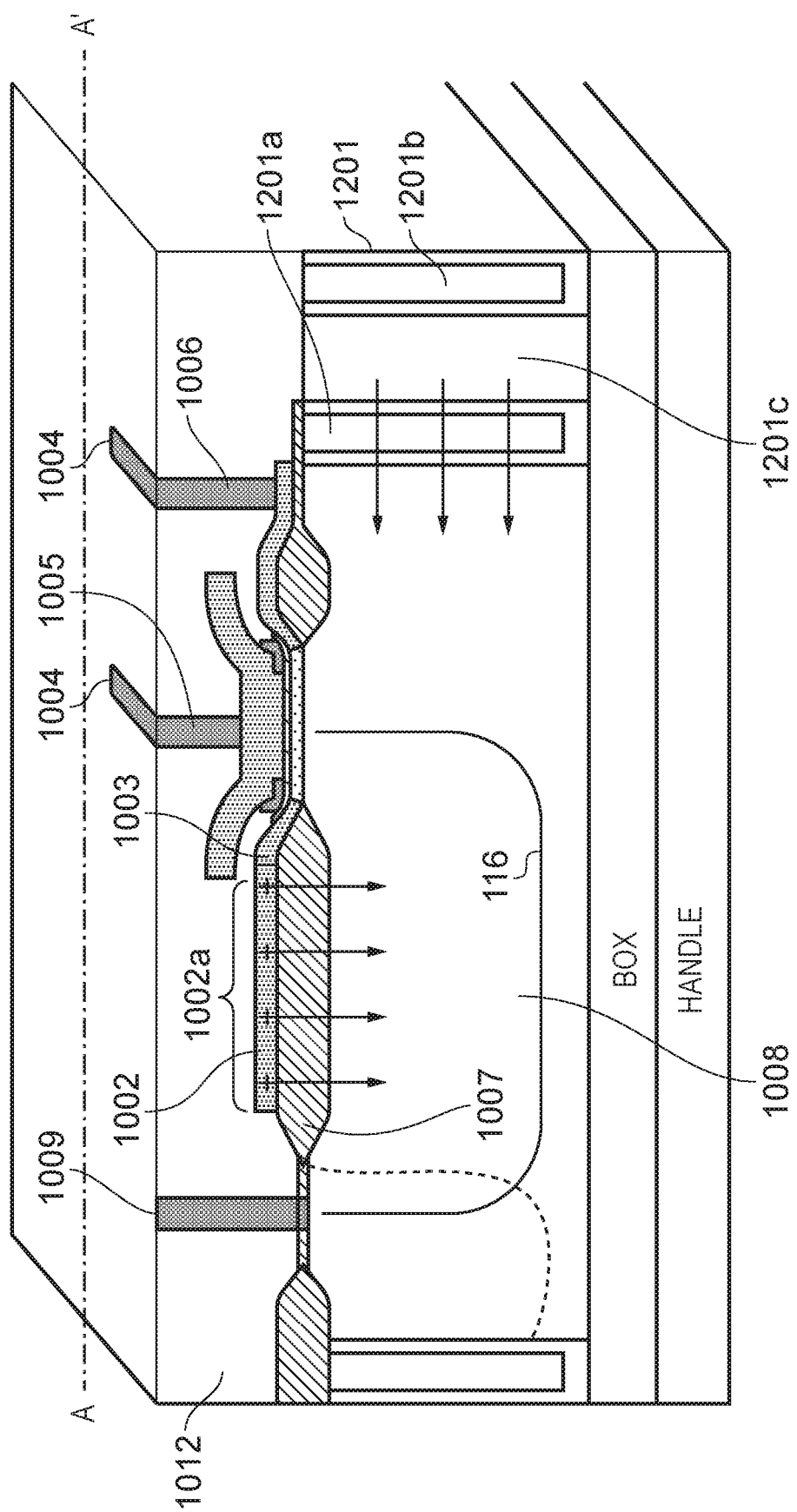
FIG. 12 is a cross-section schematic of a bipolar junction transistor with a charge control structure according to another embodiment of this disclosure.
Figure 12I:
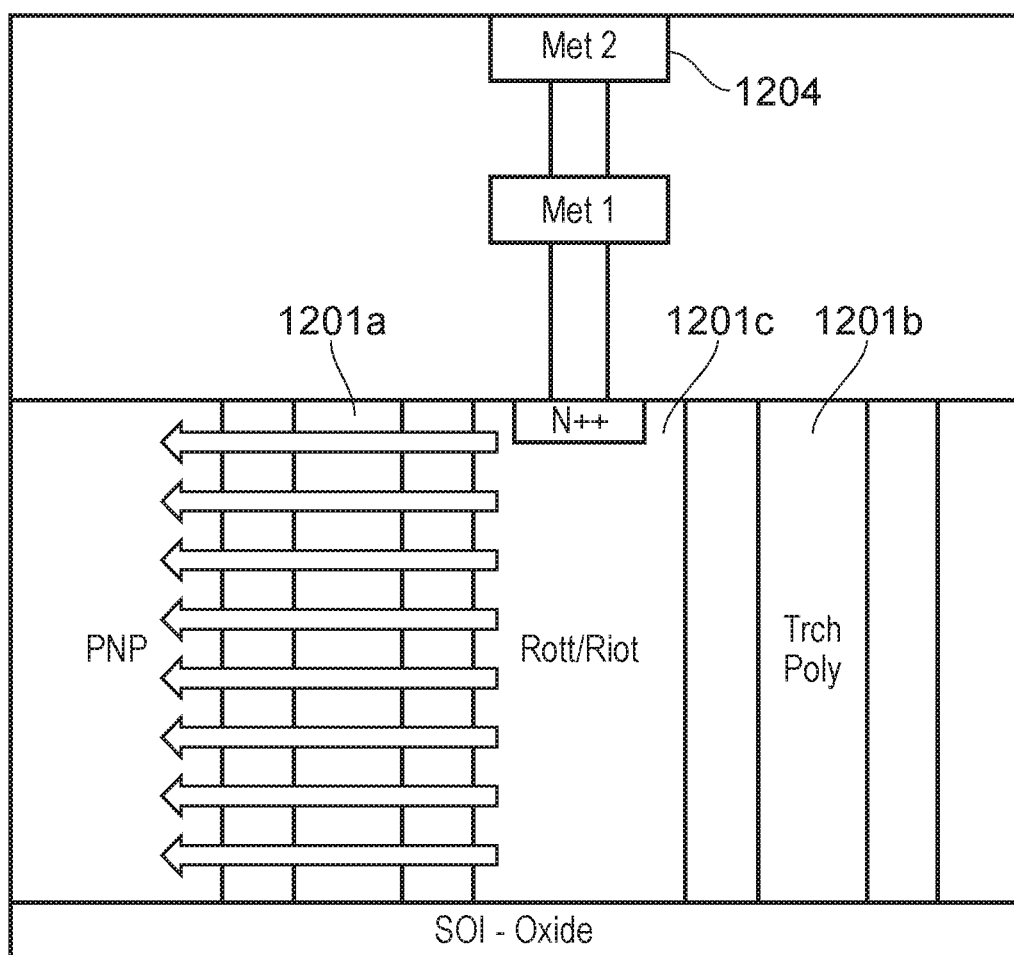
FIG. 12(i) is a cross-section schematic showing the electrical connections to control the potential of the charge control structure of FIG. 12.

FIG. 12 shows another embodiment of the charge control structure. In this embodiment, there is a double trench structure 1201 on one side of the transistor adjacent to the base contact 1006. The double trench structure is the same as the embodiment in FIG. 2H(ii). It comprises a first trench 1201*a*, a second trench 1201*b* and a semiconductor region, usually a silicon region, 1201*c* between the two trenches. In this embodiment, the silicon region is held at a fixed potential to control the electric field across the trench to couple to the charge in the collector-base space charge region as shown schematically in FIG. 12.

FIG. 12(*i*) shows a part of a cross section of the transistor through the line A-A' in FIG. 12. In FIG. 12(*i*), an electrical contact to the silicon region 1201*c* is made using a metal via 1204 that extends through an aperture in the insulating layers 1012 to contact a doped region in the silicon region 1201*c*.

In some embodiments, the charge control structure may comprise only the lateral field plate 1002. In some embodiments, the charge control structure may comprise only the trench structure 1001 or 1201.

Figure 13A:
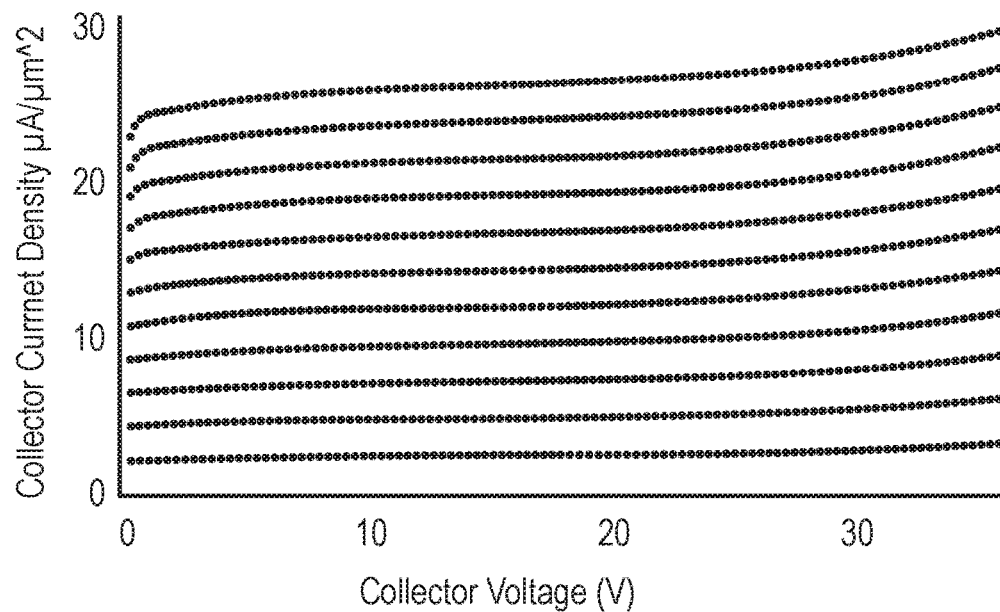
FIG. 13(a) and FIG. 13(b) are graphs of the output characteristics of a bipolar junction transistor implementing a charge control structure according to an embodiment of this disclosure.
Figure 13B:
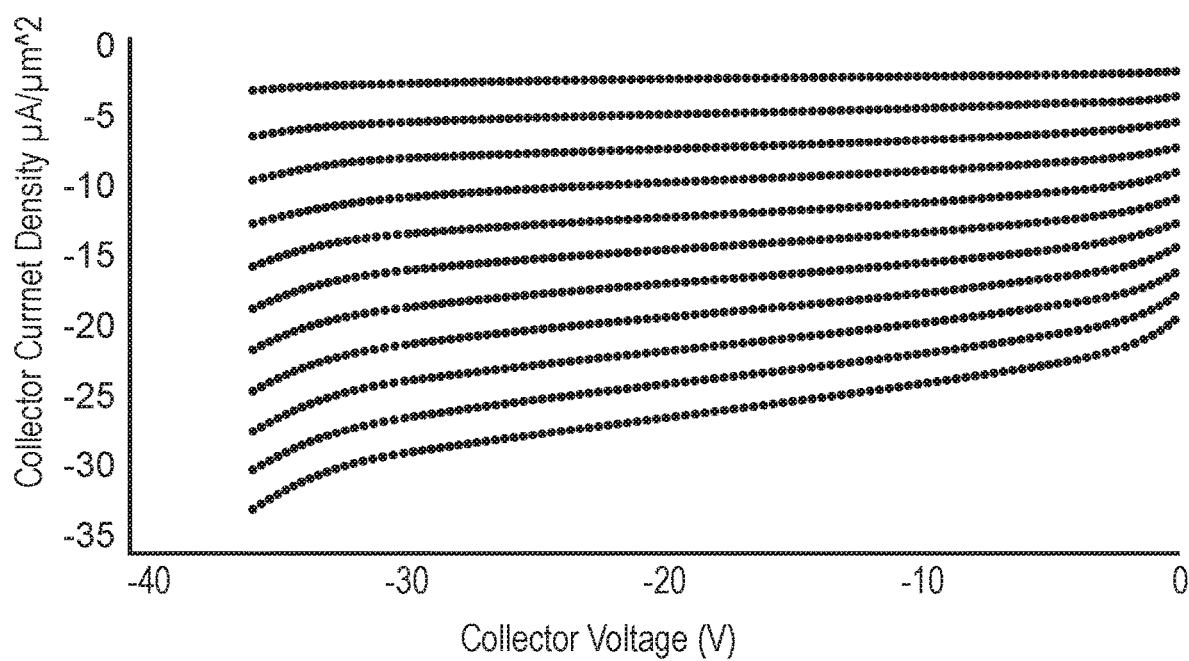

FIGS. 13(*a*) and 13(*b*) are a graphs of the output characteristics of a PNP transistor implementing a multilayer collector, an emitter, a base and a charge control structure according to an embodiment of this disclosure.

EXAMPLES

Example 1 is a bipolar junction transistor, comprising: a collector; a base comprising an intrinsic base region and an extrinsic base region, the intrinsic base having a upper surface; and an emitter positioned above of the upper surface of the intrinsic base.

Example 2 is a bipolar junction transistor according to Example 1, wherein the base is a layer of doped semiconductor, the upper surface of the intrinsic base being part of the upper surface of the layer of doped semiconductor.

Example 3 is a bipolar junction transistor according to Example 1 or Example 2 wherein the emitter is a formed of polysilicon and wherein the emitter is formed over the base layer.

Example 4 is a bipolar junction transistor according to any of the above Examples 1-3, wherein the emitter is physically separated from the base layer.

Example 5 is a bipolar junction transistor according to any of the above Examples 1-4 further comprising an interfacial layer, positioned between the emitter and the intrinsic base.

Example 6 is a bipolar junction transistor according to any of the above Examples 1-5 wherein the upper surface of the intrinsic base is substantially planar.

Example 7 is a bipolar junction transistor according to any of the above Examples 1-6 wherein a distance between an edge of the emitter and a transition between the extrinsic base region and the intrinsic base region is reduced in order to optimise the speed of the transistor.

Example 8 is a bipolar junction transistor according to Example 7 wherein the distance between the edge of the emitter and the transition between the extrinsic base region and the intrinsic base region is predetermined in order to control the speed of the device.

Example 9 is a bipolar junction transistor according to Example 7 or Example 8, wherein the transistor is a NPN silicon transistor and wherein the distance between the edge of the emitter and the transition between the extrinsic base region and the intrinsic base region is 0.8 μm or less.

Example 10 is a bipolar junction transistor according to any of the above Examples 1-9, wherein the transistor is an NPN silicon transistor and a height of the emitter is approximately between 150 nm to 180 nm.

Example 11 is a bipolar junction transistor according to Example 7 or Example 8 wherein the transistor is a PNP silicon transistor and wherein the distance between the edge of the emitter and the transition between the extrinsic base region and the intrinsic base region is 0.55 μm or less.

Example 12 is a bipolar junction transistor according to any of Examples 1-8 or Example 11, wherein the transistor is a PNP silicon transistor and a height of the emitter is at least 300 nm.

Example 13 is a bipolar transistor according to any of the above Examples 1-12 further comprising spacer regions, positioned between an edge of the emitter and the intrinsic base, wherein the spacer regions are configured to define a width of a region of the emitter adjacent the intrinsic base, and optionally wherein the spacer-regions are L-shaped, and/or the spacer-regions are formed of an oxide.

Example 14 is a bipolar transistor according to Example 13, wherein the width of the region of the emitter adjacent the intrinsic base is less than 0.6 μm.

Example 15 is a bipolar transistor according to any of the above Examples 1-14, wherein the height of the interfacial layer is configured to optimise a gain of the bipolar transistor, and optionally wherein the transistor is an NPN silicon transistor and a height of the interfacial layer is less than approximately 500 pm, or the transistor is a PNP silicon transistor and a height of the interfacial layer is approximately 500 pm.

Example 16 is a bipolar transistor according to any of Examples 2 to 15, wherein the doped semiconductor layer is SiGe.

Example 17 is a method for fabricating an NPN and a PNP bipolar junction transistors on the same substrate, comprising: providing a wafer; forming collectors for an NPN and PNP transistors; forming a base and an emitter of the NPN transistor, the emitter being formed in a thermal furnace; forming a base and an emitter for a PNP transistor, the emitter being epitaxially grown; and forming emitter, collector and base contacts for the PNP and NPN transistors.

Example 18 is a method according to Example 17, further comprising: dielectrically isolating the NPN and PNP collectors from each other using a trench structure, and forming a first dielectric layer on an upper surface of the collectors and the trench structure, the first dielectric layer comprising at least two openings to expose portions of the upper surface of each of the collectors; and optionally further comprising: depositing a semiconductor layer across the collectors.

Example 19 is a method according to Example 18, wherein the step of forming the bases for the NPN and PNP transistors includes forming intrinsic regions of the respective bases in portions of the semiconductor layer covering the exposed portion of the upper surface of the respective collectors of the NPN and PNP transistors, and optionally wherein the emitters of the NPN and PNP transistors are polysilicon, and the polysilicon emitters are positioned above the respective intrinsic regions of the bases.

Example 20 is a method for fabricating a bipolar junction transistor, comprising: providing a wafer; forming a collector, forming an intrinsic base region and an extrinsic base region, the intrinsic base having a upper surface; and forming an emitter above of the upper surface of the intrinsic base; forming emitter, collector and base contacts.

Example 21 is a bipolar junction transistor, comprising: an emitter; a base; and a collector; wherein the collector comprises a plurality of individually grown epitaxial layers, each layer having a respective dopant implant such that each layer has a respective dopant profile.

Example 22 is a bipolar junction transistor according to any of Examples 1-16, wherein the collector comprises a plurality of individually grown epitaxial layers, each layer having a respective dopant implant such that each layer has a respective dopant profile.

Example 23 is a bipolar junction transistor, according to Example 21 or Example 22, wherein the dopant profiles are at least partially determined by the thickness of each layer.

Example 24 is a bipolar junction transistor according to Example 23, wherein the dopant profiles are dopant concentration profiles.

Example 25 is a bipolar junction transistor according to Example 24, wherein the respective dopant concentration profile for each layer is different to that of the other layers.

Example 26 is a bipolar junction transistor according to any of Examples 21-25, wherein each layer has a thickness that is different to that of the other layers.

Example 27 is a bipolar junction transistor according to any of Examples 21-26, wherein the collector has three individually grown epitaxial layers, including a buried layer, an intermediate layer and a top layer.

Example 28 is a bipolar junction transistor according to Example 27, wherein the intermediate layer is thicker than the top layer.

Example 29 is a bipolar junction transistor according to any of Examples 21-28, wherein each layer has a maximum dopant concentration and the maximum dopant concentration for the buried layer is higher than the maximum dopant concentrations of the other layers.

Example 30 is a bipolar junction transistor according to any of Examples 21, Example 22 when dependent on Examples 1-8, 11-16, Examples 23-29, wherein the transistor is a PNP transistor and the dopant is P-type.

Example 31 is a bipolar junction transistor according to Example 30, wherein the plurality of layers are silicon layers, and the dopant is boron.

Example 32 is a bipolar junction transistor according to any of Examples 21-31, wherein the collector has an overall dopant concentration profile having an overall maximum dopant concentration, and the thickness of the buried layer is configured to limit the overall maximum dopant concentration.

Example 33 is a bipolar junction transistor according to Example 32, wherein the collector is made from silicon, the dopant is boron and the overall maximum dopant concentration is less than or equal to 1E18 $cm^{-3}$.

Example 34 is a bipolar junction transistor according to any of claims 27-33, wherein the buried layer is a p-type layer, the intermediate layer is an n-type layer overlying the p-type buried layer, and the top layer is an n-type layer overlying the intermediate layer.

Example 35 is a bipolar junction transistor according to any of claims 27-34, wherein a ratio of a thickness of the intermediate layer to a thickness of the top layer is configured to optimise dopant diffusivity rates to create a desired dopant profile across the epitaxial layers for a given thermal budget.

Example 36 is a bipolar junction transistor according to Example 35, wherein the ratio of a thickness of the intermediate layer to a thickness of the top layer is 4.5:3.3.

Example 37 is a method of manufacturing a collector of a bipolar junction transistor, comprising: providing a first layer of silicon; implanting the first layer of silicon with a first concentration of dopant; forming a second layer of silicon over the first layer; implanting the second layer of silicon with a second concentration of dopant; exposing the collector to a specified thermal budget such that each layer has a respective dopant profile.

Example 38 is a method according to Example 37, further comprising, before exposing the collector to a specified thermal budget, providing a third layer of silicon over the second layer and implanting the third layer of silicon with a third concentration of dopant.

Example 39 is a method according to Example 38, wherein the second silicon layer is epitaxially grown over the first silicon layer and the third layer is epitaxially grown over the second silicon layer.

Example 40 is a method according to any of claims 37 to 39, wherein the first layer is provided as part of a silicon on oxide wafer and wherein the first layer has a starting thickness of at least 2.2 µm.

Example 41 is a PNP bipolar junction transistor, comprising: a collector, the collector having: a buried layer, an intermediate layer and a top layer, at least the intermediate and top layers being individually grown epitaxial layers, each layer having a respective dopant implant profile; wherein: the intermediate layer is thicker than the top layer; and the dopant is boron; a base, positioned over a portion of the collector; and an emitter, positioned over the base.

Example 42 is a bipolar junction transistor according to any of Examples 1-8, 11-16 wherein the transistor is a PNP bipolar junction transistor, wherein the collector has: a buried layer, an intermediate layer and a top layer, at least the intermediate and top layers being individually grown epitaxial layers, each layer having a respective dopant implant profile; wherein: the intermediate layer is thicker than the top layer; and the dopant is boron; a base, positioned over a portion of the collector; and an emitter, positioned over the base.

Example 43 is a bipolar junction transistor, comprising: a collector; a base; an emitter; and a charge control structure configured to control, in use, a charge distribution in the collector to control the breakdown voltage of the transistor, wherein the charge control structure comprises: a first field plate, extending laterally over, and insulated from, an upper surface of the collector; and a second field plate, extending vertically adjacent, and insulated from, a side of the collector.

Example 44 is a bipolar junction transistor according to any of Examples 1-16, 21-36 or 41-42, further comprising a charge control structure configured to control, in use, a charge distribution in the collector to control the breakdown voltage of the transistor, wherein the charge control structure comprises: a first field plate, extending laterally over, and insulated from, an upper surface of the collector; and a second field plate, extending vertically adjacent, and insulated from, a side of the collector.

Example 45 is a bipolar junction transistor, comprising: a collector on a buried oxide layer of a silicon-on-oxide substrate, wherein the collector comprises a collector sink close to a first dielectrically isolated trench on a first side of the transistor; a dielectric layer recessed into the upper surface of the collector, wherein the dielectric layer comprises a plurality of openings; an emitter and a base proximal to a second dielectrically isolated trench on a second side of the transistor opposite to the first side, wherein the emitter is positioned over a crystalline intrinsic region of the base; a first field plate structure extending laterally over the dielectric layer towards the collector sink; an emitter, a base and a collector contact, wherein the base contact connects to an extrinsic polycrystalline portion of the base, such that the base contact is aligned with and positioned over the second dielectrically isolated trench.

Example 46 is a bipolar junction transistor according to any of Examples 1-16, 21-36 or 41-42, wherein the collector on a buried oxide layer of a silicon-on-oxide substrate, wherein the collector comprises a collector sink close to a first dielectrically isolated trench on a first side of the transistor; a dielectric layer recessed into the upper surface of the collector, wherein the dielectric layer comprises a plurality of openings; an emitter and a base proximal to a second dielectrically isolated trench on a second side of the transistor opposite to the first side, wherein the emitter is positioned over a crystalline intrinsic region of the base; a first field plate structure extending laterally over the dielectric layer towards the collector sink; an emitter, a base and a collector contact, wherein the base contact connects to an extrinsic polycrystalline portion of the base, such that the base contact is aligned with and positioned over the second dielectrically isolated trench.

Although this invention has been described in terms of certain embodiments, the embodiments can be combined to provide further embodiments. In addition, certain features shown in the context of one embodiment can be incorporated into other embodiments as well.

What is claimed is:

1. A bipolar junction transistor, comprising:
a collector;
a base;
an emitter; and
a charge control structure configured to control a charge distribution in the collector to control a breakdown voltage of the bipolar junction transistor, wherein the charge control structure comprises:
a first field plate, extending laterally over, and electrically insulated from, an upper surface of the collector; and
a second field plate, extending vertically adjacent to, and electrically insulated from, a side of the collector.

2. The bipolar junction transistor according to claim 1, wherein the first field plate extends from the base towards a collector contact.

3. The bipolar junction transistor according to claim 2, wherein the collector contact is positioned towards a first side of the bipolar junction transistor, and the base is positioned towards a second side of the transistor, opposite the first side.

4. The bipolar junction transistor according to claim 3, wherein the base has a base contact, and the emitter has an emitter contact, positioned between the collector contact and the base contact, a lateral length of the first field plate being greater than a lateral distance between the emitter and base contacts.

5. The bipolar junction transistor according to claim 4, wherein the lateral distance between the emitter and base contacts is measured from center points thereof.

6. The bipolar junction transistor according to claim 4, wherein the lateral length of the first field plate is at least three quarters of the lateral distance between the emitter and collector contacts.

7. The bipolar junction transistor according to claim 6, wherein the lateral distance between the emitter and collector contacts is measured from center points thereof.

8. The bipolar junction transistor according to claim 1, wherein the first field plate is electrically insulated from the collector by a first dielectric layer, positioned between the upper surface of the collector and the first field plate.

9. The bipolar junction transistor according to claim 1, wherein the first field plate comprises a layer of doped semiconductor material.

10. The bipolar junction transistor according to claim 1, wherein the bipolar junction transistor has a trench structure adjacent a side of the collector, and the second field plate forms part of the trench structure.

11. The bipolar junction transistor according to claim 1, wherein the second field plate is electrically conductive and is coupled to a field plate contact, such that the potential at the second field plate is configured to be controlled.

12. The bipolar junction transistor according to claim 10, wherein the trench structure comprises a double trench, wherein each of the double trench is separated from the other of the double trench by the second field plate.

13. The bipolar junction transistor according to claim 12, wherein the double trench comprises a first trench, positioned between the collector and the second field plate, the first trench comprising a doped semiconductor dielectrically isolated from the collector and the second field plate.

14. The bipolar junction transistor according to claim 10, wherein the trench structure comprises a doped semiconductor dielectrically isolated from the collector.

15. The bipolar junction transistor according to claim 14, wherein the trench structure is horizontally aligned with and positioned beneath a base contact.

16. A method of manufacturing the bipolar junction transistor of claim 1, the method comprising:
providing a wafer;
forming a collector region;
forming the second field plate extending vertically adjacent to and electrically insulated from a side of the collector region;
forming a base region;
forming the first field plate extending laterally over and electrically insulated from an upper surface of the collector region;
forming an emitter region; and
forming contacts for each of the collector, base and emitter regions to form the collector, base and the emitter of the transistor, wherein the first and second field plates form the charge control structure configured to control the charge distribution in the collector to control the breakdown voltage of the transistor.

17. The method according to claim 16, further comprising forming a trench structure around the collector region, wherein the trench structure includes the second field plate.

18. The method according to claim 16, wherein the collector region is epitaxially grown, and the method further comprises:
forming a dielectric layer over the collector region, the dielectric layer insulating the first field plate from the collector region;
forming an opening in the dielectric layer; and
depositing a layer of semiconductor over the dielectric layer and doping the layer of semiconductor to form the base region and the first field plate.

19. The method according to claim 16, wherein the wafer is a silicon-on-oxide wafer.

20. A bipolar junction transistor, comprising:
a collector on a buried oxide layer of a silicon-on-oxide substrate, wherein the collector comprises a collector sink close to a first dielectrically isolated trench on a first side of the bipolar junction transistor;
a dielectric layer recessed into the upper surface of the collector, wherein the dielectric layer comprises a plurality of openings;
an emitter and a base proximal to a second dielectrically isolated trench on a second side of the transistor opposite to the first side, wherein the emitter is positioned over a crystalline intrinsic region of the base;
a first field plate structure extending laterally over the dielectric layer towards the collector sink; and
an emitter contact, a base contact and a collector contact, wherein the base contact connects to an extrinsic polycrystalline portion of the base, such that the base contact is aligned with and positioned over the second dielectrically isolated trench.

* * * * *